United States Patent [19]
Goupillaud et al.

[11] Patent Number: 4,599,567
[45] Date of Patent: Jul. 8, 1986

[54] SIGNAL REPRESENTATION GENERATOR

[75] Inventors: Pierre L. Goupillaud, Del Mar, Calif.; Jean P. Morlet, St. Germain en Laye; Alexandre Grossmann, Roy d'Espagne, both of France

[73] Assignee: Enelf Inc., San Diego, Calif.

[21] Appl. No.: 518,429

[22] Filed: Jul. 29, 1983

[51] Int. Cl.$^4$ .............................................. G01R 23/165
[52] U.S. Cl. ............................... 324/77 G; 324/77 E; 324/78 F; 328/14; 328/105
[58] Field of Search ............... 324/77 E, 77 G, 77 H, 324/78 F, 79 R, 102, 78 D; 367/43, 49; 375/96; 364/485, 726; 84/454, DIG. 9; 179/84 VF; 328/14, 75, 105, 138

[56] References Cited

U.S. PATENT DOCUMENTS

| | | | |
|---|---|---|---|
| 3,611,411 | 10/1971 | Moshier et al. | 324/77 E |
| 3,714,566 | 1/1973 | Kang | 324/77 E |

OTHER PUBLICATIONS

Gabor, Lectures on Communication Theory, Research Laboratory of Electronics, Massachusetts Institute of Technology, Cambridge, Massachusetts, Apr. 3, 1952.
Morlet, Sampling Theory and Wave Propagation, Proceedings of the Oct. 1981 Annual Meeting of the Society of Exploration Geophysicists, Mar. 1982.
Morlet et al., Wave Propagation and Sampling Theory—Part I: Complex Signal and Scattering in Multilayered Media, 47 Geophysics 203-221, Feb. 1982.
Morlet et al., Wave Propagation and Sampling Theory—Part II: Sampling Theory and Complex Waves, 47 Geophysics 222-236, Feb. 1982.
Morlet, Sampling Theory and Wave Propagation, NATO ASI Series, vol. F1, Springer-Verlag Berlin Heidelberg 1983, pp. 223-261.

*Primary Examiner*—Reinhard J. Eisenzopf
*Assistant Examiner*—Kevin D. O'Shea
*Attorney, Agent, or Firm*—Dunlap, Codding & Peterson

[57] ABSTRACT

An apparatus and method for generating a representation of an arbitrary signal wherein the signal is represented as a sum of reference signals derived from a standard wavelet defined on a grid in the frequency-time plane. The apparatus comprises a plurality of octave circuits, each octave circuit, in turn, comprising a plurality of band circuits that divide a frequency range covering the spectrum of the signal into equal intervals of logarithm of frequency. Each band circuit comprises a bandpass filter to select a frequency component of the signal and a correlator to correlate the signal component with a reference signal derived from a standard wavelet to produce a series of correlation values representing the signal for recordation in response to clock pulses received by the octave circuits. The octave circuits are clocked at rates which increase by a factor of two with increasing octave of frequency with which the octave circuits are associated so that correlation time intervals decreasing by a factor of two for successively higher frequency octaves are defined for all frequency bands within each octave and one correlation value is associated with each octave and one correlation value is associated with each frequency band and with each correlation time interval to effect the representation.

18 Claims, 11 Drawing Figures

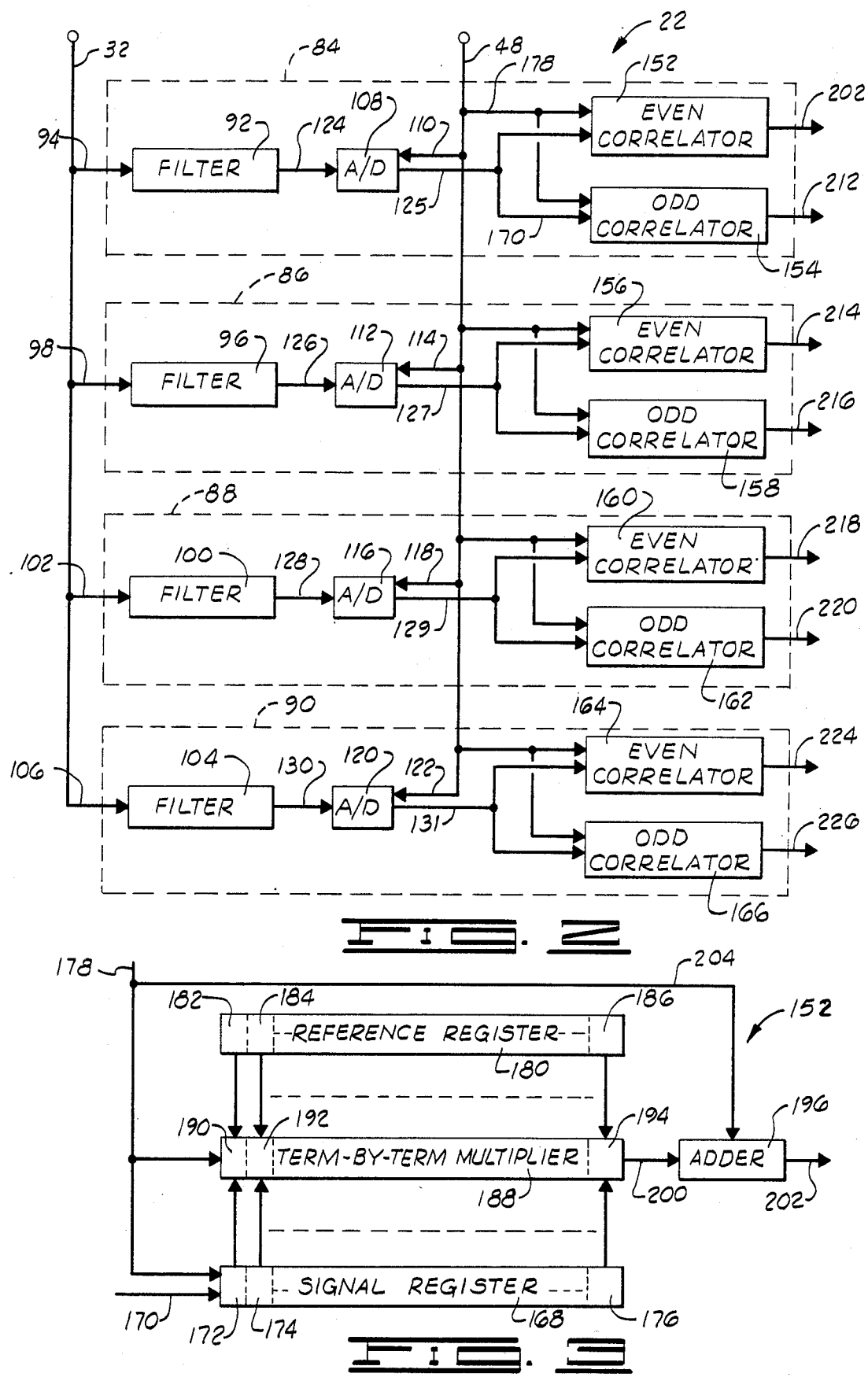

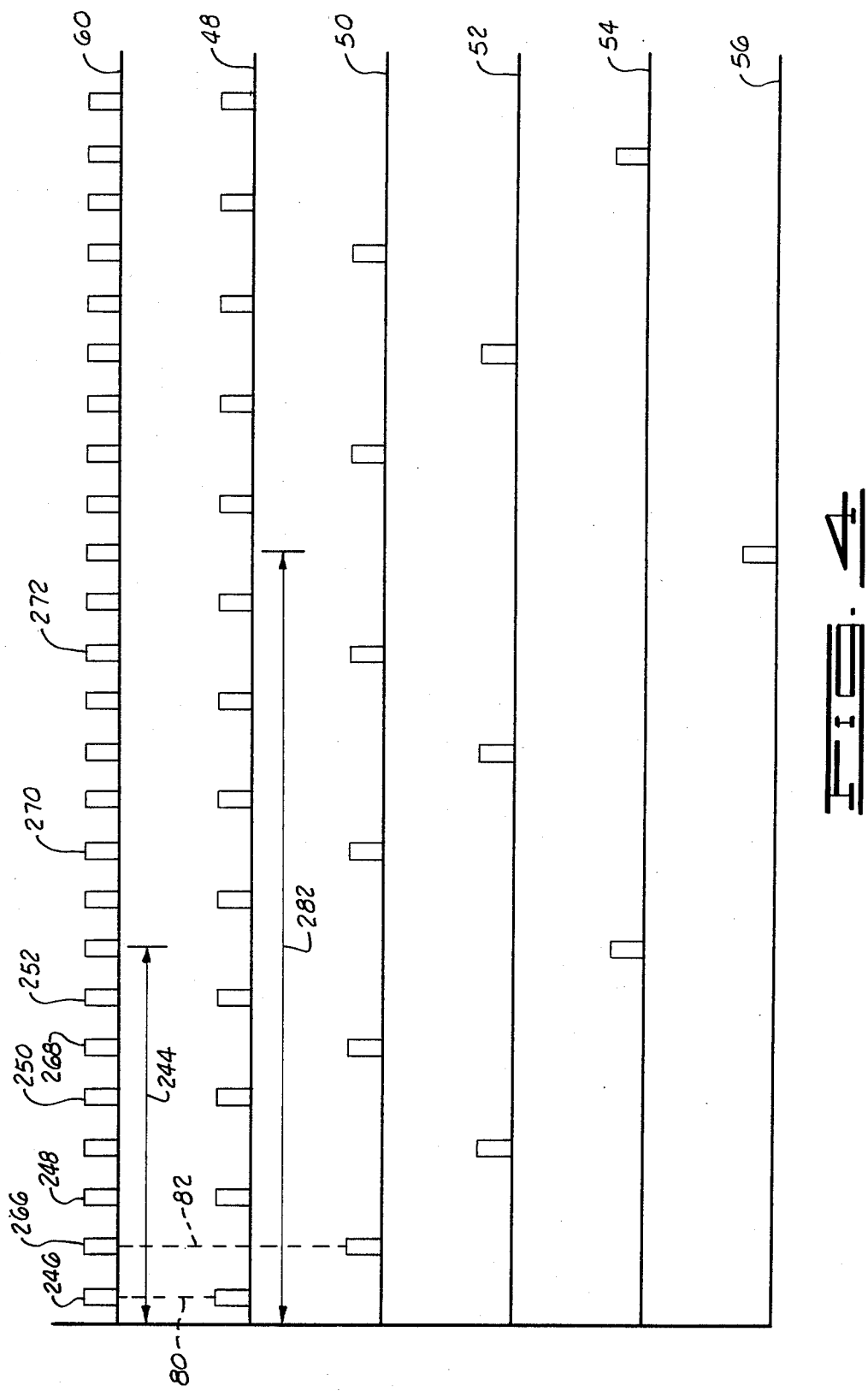

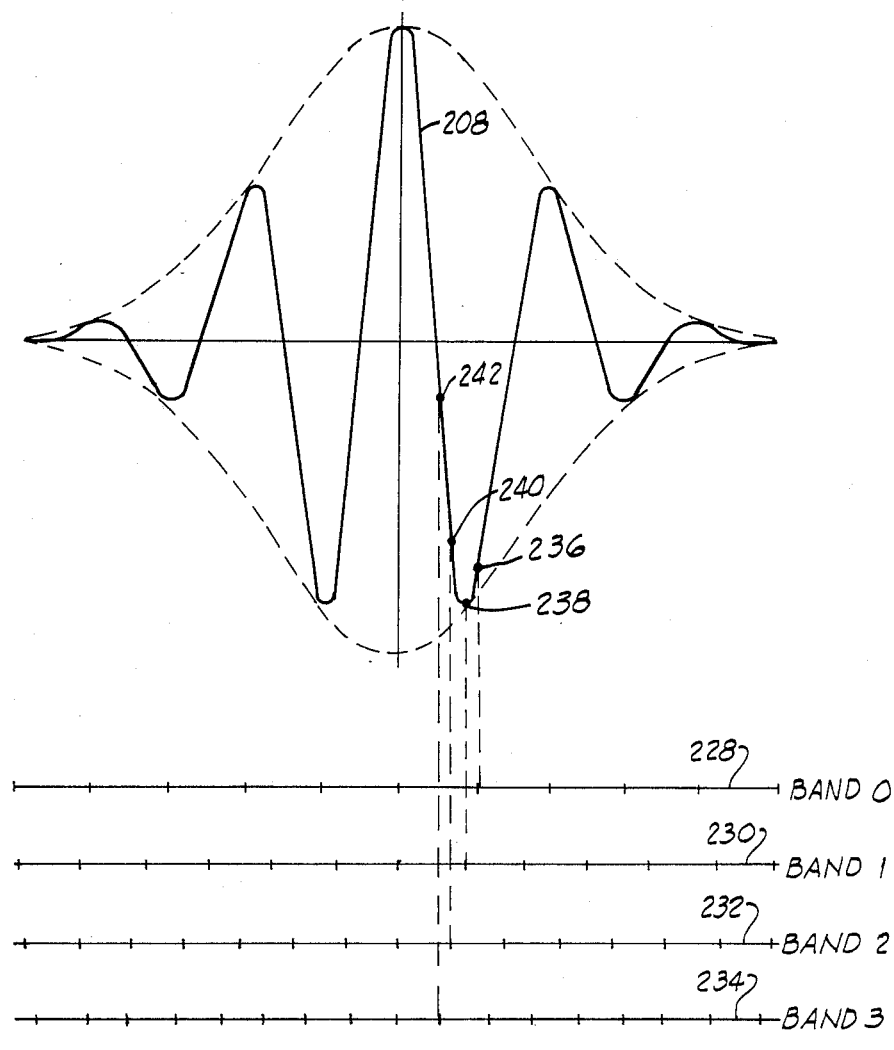
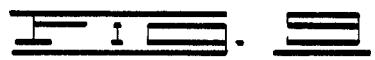

SIGNAL REPRESENTATION GENERATOR

BACKGROUND OF THE INVENTION

1. Field of the Invention.

The present invention relates generally to signal decomposition methods and apparatus and, more particularly, but not by way of limitation, to systems for providing representations of transient signals.

2. Brief Description of the Prior Art.

When a person measures or records a signal of some type; for example, the output of a microphone or geophone, he is generally not interested in the signal per se. Rather, the signal carries information and it is the information carried by the signal that he is after.

Very often, the recordation or measurement of the signal is only a first step in obtaining the information. From an information point of view, the signal, which expresses the variation of a physical quantity with time, is merely one of various representations of the information the signal contains. For example, it is well known that information expressed as a varying signal in the time domain can also be expressed as a combination of pure tones having different amplitudes, frequencies and phases in the frequency domain. In some cases, a time domain representation of the information is well suited to the information gatherer's purposes and in other cases, a frequency domain representation will be better suited to these purposes.

However, there exist situations in which neither of these representations of information which is obtainable by recording a signal is particularly well suited to the purpose for which the information has been gathered. Such is particularly true when the phenomenon underlying the production of the signal is transient in nature. In such circumstances, it may well be the case that neither a pure time domain representation nor a pure frequency domain representation will provide the information gatherer with the type of data he needs to make use of the information. Because of the inadequacy of these representations of information carried by a signal to express the information in a useable form, a hybrid representation, having both time and frequency aspects, was proposed by Dennis Gabor in 1946. Such proposal has been summarized in Technical Report No. 238 by D. Gabor, published by the Research Laboratory of Electronics at the Mass. Institute of Technology on April 3, 1952.

In the hybrid representation suggested by Gabor, a signal would be decomposed into a plurality of wavelets which would each be associated with a cell in the combined time-frequency domain which Gabor referred to as the information plane. The cells would form a rectangular grid so that each cell would be defined by a fixed interval in each of the time and frequency domains. The wavelets proposed by Gabor had the general form of a sinusoid contained within a gaussian envelope and, in order that the representation, once obtained, would contain the maximum information theoretically possible, each cell had unit area. An important aspect of the wavelet proposed by Gabor, as well as wavelets with which the present invention is concerned, is that the wavelets have both time and frequency characteristics. That is, the cell with which the wavelet is associated is defined by a particular frequency interval and a particular time extent. This characteristic makes the wavelets particularly well suited for representing transient signals.

While the hybrid representation proposed by Gabor held great promise for extracting information contained in a transient signal, the proposal was subject to practical difficulties which have resulted in the proposal not having been implemented prior to the present invention. In particular, Gabor recognized the non-orthogonality of his representation, but, indeed, the main difficulty was due to the fact that for the wavelet described by Gabor the higher the frequency, the higher the number of periods in the wavelet. It follows that the Gabor expansion presents the same shortcomings as the Fourier expansion for high frequencies; that is, undersampling. As a result, Gabor's suggestion lay dormant until about 1980 when further theoretical developments were made by Jean Morlet, such developments having been published in a series of articles beginning in 1981.

To overcome the difficulties associated with the time-frequency representation proposed by Gabor, Morlet proposed that a non-rectangular grid be used to effect the decomposition. In particular, Morlet suggested that the frequency scale be divided into suboctave bands, rather than constant frequency intervals, and that a different time scale be used for each band. In particular, the time scale for each band would be chosen to be a fixed portion of a standard wavelet, expressed in cycles, defined by limiting a sinusoid having the frequency associated with the band by an envelope that has appreciable values for only a few periods of the sinusoid. That is, the general form of the wavelet would be the same for all cells so that the wavelet can be generally defined and, after such definition, used to establish time scales for the various bands. It will be noted that a wavelet defined for one cell would differ from a wavelet defined for another cell only by a translation and a dilation or contraction in the time domain. Morlet was then able to show that the cells so defined would have equal areas in the time-frequency domain so that such a representation would be capable of at least approaching the theoretical maximum information contained within the signal so represented, and more particularly would give a good representation of the phase information.

However, Morlet's proposal introduced a new problem with respect to a practical implementation of the time-frequency representation of a signal. To obtain the maximum information available in a signal, the bands and wavelet portions used to define the grid in the time-frequency plane give rise to complex relationships between the time extents of the cells. Thus, a mismatch exists between time intervals defined on the cycle-octave grid and real times defined by clocks which would have to be used to specify a practical time-frequency representation of a signal. The present invention is based on a further theoretical development which has solved this grid time-clock time mismatch. Such development will be discussed below.

SUMMARY OF THE INVENTION

The present invention provides an apparatus and method for generating a time-frequency representation of an arbitrary signal in order to extract the maximum information carried by the signal. In particular, the apparatus comprises a plurality of overlapping bandpass filters which each decompose an arbitrary signal into one of a selected set of frequencies defined on a logarithmic scale. Each of these frequency components is then correlated with a reference signal derived from a standard wavelet to produce a sequence of correlation signals which are subsequently recorded. In particular, the apparatus and method of the present invention provides for the generation of a plurality of recorded signals which are particularly suited for displaying time and frequency information contained within transient signals. Moreover, the standard wavelet used to generate the correlation signals expressing the information contained in a signal can be selected with respect to a phenomenon of interest to the user of the present invention to provide the information contained in a signal in a manner which is realistic with respect to such phenomenon. Additionally, the present invention provides an apparatus and method in which the representation of information in a signal can stress the time aspects of the information or, conversely, can stress the frequency aspects of such information.

An important object of the present invention is to provide a method and apparatus for generating a representation of a signal which is transient in time.

Another object of the invention is to provide an apparatus and method for generating a representation of a signal which is matched to the physical phenomenon by means of which the signal is produced.

Yet another object of the present invention is to provide a method and apparatus for generating a representation of the information in a signal which can be selected to stress time or frequency aspects of such information.

Other objects, features and advantages of the present invention will become clear when read in conjunction with the following detailed description of the invention and appended claims.

BRIEF DESCRIPTION OF THE DRAWINGS

FIG. 2 is a schematic circuit diagram of an octave circuit used in the signal representation generator of FIG. 1.

FIG. 3 is a schematic circuit diagram of a correlator used in a band circuit forming a portion of an octave circuit of the signal representation generator.

FIG. 4 is a timing diagram illustrating the manner in which the octave circuits of the signal representation generator are clocked.

FIG. 9 is a diagram illustrating the manner in which reference signal values are derived from a standard wavelet for correlation with a signal received by the signal representation generator.

DESCRIPTION OF THE PREFERRED EMBODIMENT

Figure 1:
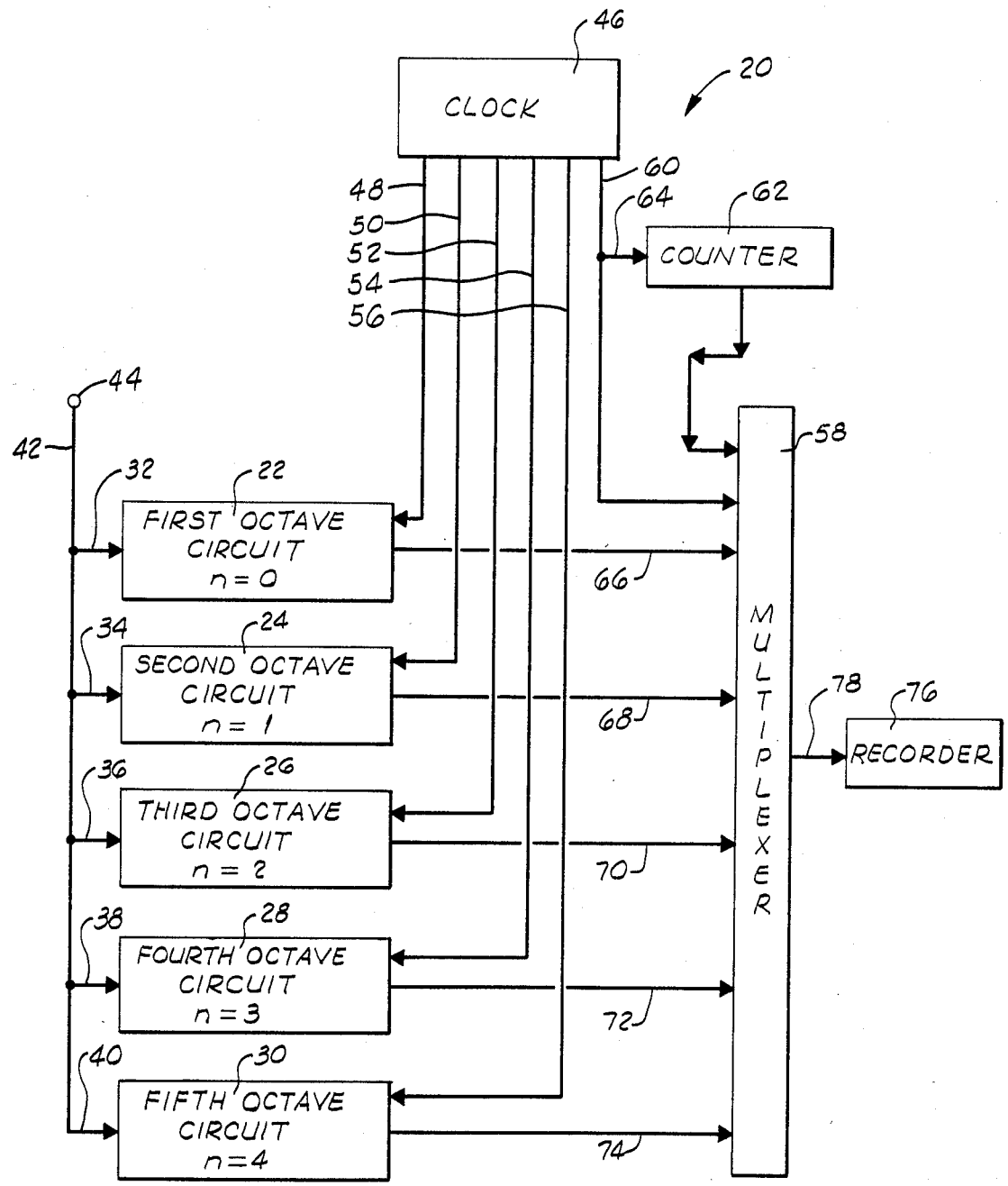
FIG. 1 is a schematic circuit diagram of one preferred embodiment of a signal representation generator constructed in accordance with the present invention.

Referring now to the drawings, illustrated therein is the circuit diagram for one preferred embodiment of the signal representation generator of the present invention and, further, criteria utilized in the selection of operating characteristics of components of the signal representation generator. In particular, circuit diagrams for the signal representation generator, designated by the general reference numeral 20 in FIG. 1, have been illustrated in FIGS. 1-3 and 11 and FIGS. 4-10 have been included to illustrate criteria by means of which signals produced and recorded by the signal representation generator are related to a representation of an arbitrary signal in terms of a standard form wavelet associated with cells of one preferred grid defined on the information plane.

Referring first to FIG. 1, the signal representation generator 20 comprises a plurality of similar octave circuits 22-30 which differ primarily in the selection of frequencies to which the octave circuits respond. In general, the first octave circuit, designated 22 in FIG. 1, responds to the highest portion of a frequency range selected for decomposition of an arbitrary signal; the second octave circuit, designated 24 in FIG. 1, responds to a next lower portion of the selected frequency range; and such decrease in the portions of the frequency range to which an octave circuit responds is carried out to the fifth octave circuit 30 which responds to the lowest frequency portion of the range. As will become clear below, the number of octave circuits included in the signal representation generator can be selected to cover substantially any frequency range and, further, the portions of the selected frequency range to which each octave circuit responds can be conveniently identified by an index n that runs serially from zero for the first octave circuit; that is, the octave circuit responding to the highest frequencies in the range, to a number one less than the selected number of octave circuits for the octave circuit responding to the lowest frequencies in the range. The index n has been indicated for the octave circuits 22-30 in FIG. 1. Each of the octave circuits 22-30 is connected, via signal paths 32-40, for the octave circuits 22-30 respectively, and a signal path 42 to a generator input terminal 44 which receives a signal to be decomposed.

The signal representation generator 20 further comprises a clock 46 which periodically provides clock pulses to each of the octave circuits 22-30 in accordance with a timing diagram shown in FIG. 4, the clock pulses to octave circuits 22-30 being transmitted on clock paths 48-56 respectively. In addition, and also in accordance with the timing diagram of FIG. 4, the clock 46 supplies clock pulses to the clock input of a multiplexer 58 via clock path 60 and to a counter 62 via the clock path 60 and a clock path 64. The output terminals of the counter 62 are connected to the data selection terminals of the multiplexer 58 to cause the multiplexer 58 to transmit one of a plurality of correlation signals supplied to the multiplexer from the octave circuits 22-30, on buses 66-74 respectively, to a recorder 76 via a signal transmission channel 78. (As will become clear below, the correlation signals are preferably provided in digitized form on a plurality of parallel signal paths. For clarity, each such plurality of signal paths will be referred to herein as a channel and a collection of channels will be referred to herein as a bus. It will also be clear to those skilled in the art that the multiplexer 58 will include a plurality of sections in order to transmit a digitized signal expressed as a plurality of bits transmitted over a plurality of signal paths comprising a channel.) The recorder includes a conventional coder in order that the signal present at the output terminals of the multiplexer can be coded and recorded in a suitable recording medium such as, for example, a magnetizable tape or disk. Such recorders are conventional so that the recorder 76 need not be further discussed for purposes of the present disclosure.

Referring now to FIG. 4, it will be useful to briefly discuss the timing diagram for the clock 46 before continuing with the description of the construction of the signal representation generator 20 and, for such purpose, the timing diagram has been drawn to include a plurality of axes corresponding to the clock paths 48–56 and the clock path 60. For clarity, these axes have been numbered using the same numerical designations as the clock paths to which the axes correspond and clock pulses on each signal path have been indicated from left to right in the order in which a series of pulses are impressed on the clock paths during the operation of the signal representation generator 20. In particular, the clock 46, and the counter 62, are selected to be resettable and FIG. 4 illustrates a sequence of pulses, beginning from the left in FIG. 4, that would appear on each of the signal paths 60 and 58–56 immediately following the resetting of the clock 46 and the counter 62.

The salient features of the timing of the clock pulses received by the octave generators 22–30, the multiplexer 58 and the counter 62 can best be seen by comparing a series of clock pulses appearing on the clock path 60 with series of clock pulses appearing on the clock paths 48–56. Initially, it will be seen that the multiplexer 58 and counter 62 are clocked at a higher rate than any of the octave circuits and that, for every clock pulse appearing on the signal path 60, a clock pulse appears on one, and only one, of the clock paths 48–56. Such clocking permits the counter 62 to select a correlation signal from one of the octave circuits, such octave circuit being the octave circuit clocked coincidently with the multiplexer and counter, for recording each time a clock pulse is delivered to the multiplexer. (In order to phase the generation of correlation signals and the transmission of such signals to the recorder, a multiple pulse clock can be utilized so that each of the clock pulses indicated for the axis 60, and the axes 48–56, would comprise a group of clock pulses as is known in the art. In order to bring out the timing of the signal representation generator, each such group has been represented as a single pulse.) Thus, for example, a correlation signal is generated by the first octave circuit 22 and recorded in response to the first pulse generated by the clock 46 and impressed on clock path 60 after reset of the clock 46 and counter 62 as indicated by the dashed line 80 in FIG. 4; a correlation signal is generated by the second octave circuit 24 and recorded for the second pulse appearing on the clock path 60 to the multiplexer 58 as indicated by the dashed line 82 in FIG. 4; and other pulses appearing on the signal path 60 will be accompanied by the generation of a correlation signal by one of the octave circuits 22–30 and the recordation of such signal.

It will also be noticed in FIG. 4 that the octave circuits 22–30 are clocked at successively lower rates for increasing values of the index n identifying the octave circuits 22–30. Thus, the second octave circuit 24 is clocked at one half the rate at which the first octave circuit 22 is clocked; the third octave circuit 26 is clocked at one half the rate of the second octave circuit 24; and so on to the fifth octave circuit 30 which is clocked at one half the rate of the fourth octave circuit 28 and at one sixteenth the rate of the first octave circuit 22. In addition, following resetting of the clock 46, different periods of delay occur prior to the reception of an initial clock pulse for different octave circuits. Thus, no delay occurs in the transmission of a clock pulse to the first octave circuit 22 relative to the clocking of the multiplexer 58; a delay of one multiplexer clock pulse occurs before the initial clocking of the second octave circuit; a delay of three multiplexer clock pulses occurs between the initial clocking of the third octave circuit; and larger delays occur before initial clocking of the remaining octave circuits. In general, the different rates of clocking of the octave circuits and the delays prior to initial clocking of each of the octave circuits can be summarized by numbering the pulses transmitted to the multiplexer 58 following system reset and identifying which of such pulses would also be transmitted to each of the octave circuits. Such identification is expressed, using the index n that identifies the octave circuits by the equation:

$$j = 2^n + m\, 2^{n+1}, m = 0, 1, 2 \qquad (1)$$

where j is the number identifying a pulse appearing on the clock path 60. Such selection of pulses appearing on the clock path 60 to also appear on a clock path to an octave circuit can be easily effected by including a plurality of resettable ring counters in the clock 46 to be clocked by the pulses appearing on the clock path 60. Such ring counters would each be associated with one of the clock paths 48–56 and the ring counters would have different numbers of output terminals to effect the halving of the rates at which the octave circuits are clocked. That is, the ring counter associated with the clock path 50 would have twice the number of output terminals as the ring counter associated with the clock path 48. Similarly, the delays in the production of clock pulses on the signal paths 48–56 following system reset would be obtained by the choice of output terminal of the ring counter to which the clock path 48–56 associated therewith would be connected. As will be clear from the above description of the timing diagram for the signal representation generator, a selected number of clock pulses appearing on any one of the clock paths 48–56, in conjunction with the rate at which the multiplexer 58 is clocked, can be utilized to define a time interval for each of the octave circuits 22–30 and such time intervals will vary in duration from octave circuit to octave circuit by a power of two. Such selection defines an information plane grid in a manner to be discussed below.

Returning now to the description of the construction of the signal representation generator 20, and with particular reference to FIG. 2 wherein is shown a schematic circuit diagram for the first octave circuit 22, each of the octave circuits is comprised of a plurality of band circuits as indicated by the dashed line boxes in FIG. 2. In particular, in the one preferred embodiment of the invention presently under discussion, the first octave circuit 22 comprises four band circuits which have been indicated by the numerals 84–90 in FIG. 2, the other octave circuits similarly having four band circuits in such embodiment. However, it is contemplated that the octave circuits can have a greater or lesser number of band circuits; in particular, the number of band circuits to be included in an octave circuit is selected by the user of the present invention to stress the time or frequency aspects of the information contained within a signal in accordance with a criterion to be discussed below.

In the same manner that the octave circuits respond to different portions of the overall frequency range used to generate a representation of an arbitrary signal, each of the band circuits responds to a different frequency band within the range of frequencies to which the octave circuit in which the band circuit is included responds. In particular, the band circuit 84 responds to a frequency band near the high frequency limit of the first octave circuit 22; the band circuits 86 and 88 respond to successively lower, intermediate frequency bands, and the band circuit 90 responds to a frequency band near the low frequency limit of the octave circuit 22. In a manner similar to the identification of portions of the frequency range to which each octave circuit responds by the index n, an index k can conveniently be used to identify a frequency band to which each of the band circuits 84–90 responds. Consistently with the selection of the index n to increase with response to decreasing frequencies, the value of the index k associated with the highest frequency band into which an octave circuit frequency range is divided is selected to be zero and successive bands are consecutively numbered so that the band circuits 84–90 in FIG. 2 are associated with band index numbers k=0 to k=3 respectively. The band circuits in the remaining octave circuits are identically associated with the same values of the band index number k. Each of the band circuits 84–90 receives the signal to be decomposed, such signal being present on the signal path 32 that is connected to the generator input terminal 44, and each of the band circuits 84–90 receives the clock pulses impressed by the clock 46 on the clock path 48, the paths 32 and 48 having been included in FIG. 2 to illustrate the manner in which elements of the first octave circuit 22, as well as elements of the remaining octave circuits 24–30, are connected to portions of the circuit of the signal representation generator 20 illustrated in FIG. 1. In particular, each of the band circuits 84–90 includes a substantially distortion free bandpass filter and the signal path 32 provides the signal at the generator input terminal 44 to each of the filters of the band circuits 84–90. Thus, the band circuit 84 includes a bandpass filter 92 which receives the signal to be represented on a signal path 94; the band circuit 86 includes a bandpass filter 96 which receives the signal to be represented on a signal path 98; the band circuit 88 includes a bandpass filter 100 which receives the signal on a signal path 102; and the band circuit 90 includes a bandpass filter 104 which receives the signal on a signal path 106. Similarly, each of the filters includes an A/D converter which receives the clock pulses impressed on the clock path 48. In particular, the band circuit 84 includes an A/D converter 108 which receives clock pulses on clock path 110; the band circuit 86 includes an A/D converter 112 which receives clock pulses on clock path 114; the band circuit 88 includes an A/D converter 116 which receives clock pulses on clock path 118 and the band circuit 90 includes an A/D converter that receives clock pulses on clock path 122. Each of the A/D converters in a band circuit is connected to the output of the filter in the band circuit as indicated by the signal paths 124, 126, 128 and 130 for the band circuits 84–90 respectively and each of the A/D converters is of the conventional type including a sample and hold circuit and a plurality of comparators so that each of the A/D converters will generate a digital representation of the amplitude of a frequency component passed by the filter to which the A/D converter is connected each time a pulse appears on the clock path 48. These digital representations produced by the A/D converters are transmitted to correlation circuits, for a purpose to be discussed below, via channels 125, 127, 129 and 131 connected to the multiple output terminals of the A/D converters 108, 112, 116 and 120 respectively. Prior to discussing the correlation circuits, it will be useful to discuss the signal components provided by the filters 92, 96, 100 and 104 and FIG. 7 has been provided for this purpose.

Figure 7:
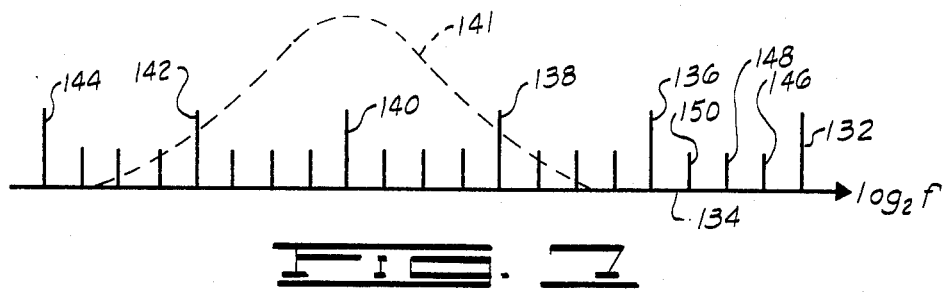
FIG. 7 is a diagram illustrating the selection of passband frequencies for overlapping bandpass filters of the signal representation generator.

FIG. 7 illustrates a graphical method for selecting the passbands of the filters 92, 96, 100 and 104 of the octave circuit 22 as well as the passbands of filters in the remaining octave circuits 24–30. To that end, the user of the signal representation generator 20 will select a frequency range for the representation which is consistent with the phenomenon from which the signal being represented is derived. For example, where the signal representation generator is used to provide a representation of a signal produced by a geophone that measures the amplitude of reflections of an elastic wave from subterranean strata in a region being seismically explored, a frequency range of from approximately 15 hertz to 250 hertz would, in many cases be appropriate. Once the frequency range has been selected, the upper limit of the range is marked on a logarithmic scale, to the base two, as indicated in FIG. 7 by the mark 132 on the logarithmic frequency axis 134. Such frequency also identifies the logarithmic center frequency of the filter in the highest frequency band circuit of the octave circuit associated with the highest frequency portion of the selected frequency range. For the embodiment of the invention illustrated, the frequency indicated by the mark 132 would be the center frequency, on a logarithmic scale, of the passband of the filter 92 in the k=0 band circuit 84 of the first octave circuit 22; that is, the octave circuit for which the index n is zero. The logarithmic center frequencies associated with the k=0 band circuits of the remaining octave circuits are then found by successive halving of the frequency indicated by the mark 132. On a logarithmic scale, as shown in FIG. 7, such frequencies form a succession of equally spaced marks as indicated by the marks 136–142 in FIG. 7 and the halving is continued until a frequency below the selected range, indicated by the mark 144 in FIG. 7, is obtained. The number of octave circuits to be included in the signal representation generator is then the number of logarithmic center frequencies, within the selected frequency range, found in this manner. Thus, for the case shown in FIG. 7, the signal representation generator would include five octave circuits wherein the uppermost passband associated with each octave circuit would be logarithmically centered on the frequencies indicated by the marks numbered 132 and 136–142. For the special case in which the highest frequency appropriate to the phenomenon that produces the signal being represented is 250 hertz, the frequencies that would be indicated by the marks 136–142 would be 125 hertz, 62½ hertz, 31¼ hertz, and 15⅝ hertz respectively.

The logarithmic scale is then used to select the logarithmic centers of the passbands for all filters in all octave circuits by dividing all of the intervals between the k=0 marks on the logarithmic scale by the selected number of band circuits to be included in each octave circuit. (As will be discussed below, one advantage of the signal representation generator is that either frequency or time aspects of a signal can be stressed in the representation formed by the signal representation generator 20. The stress is accomplished by the selection of the number of band circuits to be included in an octave circuit.) Thus, the filters in the band circuits 86–90 in the octave circuit 22 would be logarithmically centered at frequencies indicated by the marks 146–150 on the logarithmic scale 134 of FIG. 7. The logarithmic centers associated with the filters in the remaining octave circuits would then be found by similarly dividing the intervals between the marks 136–144 in FIG. 7 as indicated by the unnumbered marks therein. (The mark 144 establishes an interval that is used to determine the logarithmic centers of the filters in the octave circuit, such as the octave circuit 30 in the illustrated embodiment, that is associated with the lowest frequency portion of the selected range and has been included in FIG. 7 for this reason.) The filters in each of the band circuits of the octave circuits are then selected to each pass a band of frequencies as illustrated by the response curve 141 of the circuit corresponding to the logarithmic center frequency 140. A preferred choice for the maximum slope of the response curve is twelve decibels per octave resulting in the responses of the filters overlapping over several bands. Alternatively to the graphical selection of frequencies to which the filters in the band circuits are to respond, such frequencies can be selected analytically by means of the equation $$F_{n,k} = f_{max} 2^{-n} 2^{-k/K}, \qquad (2)$$

where $f_{n,k}$ is the logarithmic center frequency selected for the filter in the kth band circuit of the nth octave circuit, $f_{max}$ is the logarithmic center frequency selected for the uppermost band of the uppermost octave of the frequency range of interest, n and k are the indices defined above for the octave and band circuits respectively and K is the number of band circuits in each octave circuit. (The logarithmic center frequencies can also be determined from a minimum selected frequency by reversing the numbering of octave and band circuits such that the indices n, k increase with increasing frequency and by eliminating the negative signs in the exponents in equation 2.)

Referring once again to FIG. 2, each of the band circuits 84–90 of the first octave circuit 22, as well as the band circuits and the remaining octave circuits, includes a pair of correlators for correlating the signal components passed by the filters in the band circuits with a reference signal that is derived from a standard wavelet into which an arbitrary signal impressed at the generator input 22 is to be expressed. For reasons which will become clear below, one correlator in each band circuit is appropriately termed an "even" correlator and the other correlator in the band circuit is appropriately termed an "odd" correlator. Thus, in FIG. 2, the band circuit 84 comprises an even correlator 152 and an odd correlator 154; the band circuit 86 comprises an even correlator 156 and an odd correlator 158; the band circuit 88 comprises an even correlator 160 and an odd correlator 162; and the band circuit 90 comprises an even correlator 164 and an odd correlator 166. Within an octave circuit, the correlators differ one from another in respects that will be discussed shortly with respect to FIGS. 3–6 and FIG. 9 but the correlators are structurally the same from octave circuit to octave circuit. Thus, the band circuits corresponding to the index k=0 in the octave circuits 24–30 include even and odd correlators which are similar to the even and odd correlators 152 and 154; the band circuits corresponding to the index k=1 in the octave circuits 24–30 contain even and odd correlators similar to the even and odd correlators 156 and 158; and so on for all band circuits corresponding to different values of the index k for all octave circuits.

The general form of each of the correlators, even and odd, and for all band circuits in the signal representation generator 20, is illustrated in FIG. 3 wherein is shown the even correlator 152 of the band circuit 84. Such correlator comprises a signal register 168 which receives signal component amplitudes from the A/D converter 108 on a channel 170 (see also FIG. 2) and stores a sequence of values of such amplitudes, corresponding to different times at which a signal is received by the signal representation generator 20, in a plurality of storage registers of which the signal register 168 is comprised. (Three such storage registers, indicated by the numerals 172–176 have been indicated by dashed lines in FIG. 3. However, the signal register 168 will generally contain a larger number of storage registers and, moreover, the number of storage registers will be selected for each band circuit in an octave circuit to relate the result of a correlation by each correlator to an information plane representation of a signal in accordance with a criterion to be discussed below.) The storage registers of the signal register 168 are serially interconnected so that, in response to a clock pulse received by the signal register 168, a series of signal amplitudes stored in the storage registers are serially shifted down the sequence of storage registers from storage register 172 toward the storage register 176 with a new signal amplitude being entered in storage register 172 and one previously received signal amplitude being lost from storage register 176 with each clock pulse that is received by the signal register 168. The clock pulses are provided on a clock path 178 which, as shown in FIG. 2, connects to the clock path 48 so that each clock pulse supplied to the octave circuit 22 on clock path 48 causes the A/D converter 108 to provide a digital representation of the signal component currently being passed by filter 92 and further causes such representation to be entered into the first of the storage registers of the signal register 168 while shifting previously stored signal component amplitudes along storage registers of the signal register 168.

In addition to the signal register 168, the even correlator 152 comprises a reference register 180 which, like the signal register 168, is comprised of a plurality of storage registers as indicated by dashed lines in FIG. 3. The number of storage registers in the reference register 180 is equal to the number of storage registers in the signal register 168. Stored within the storage registers of the reference register 180 is a sequence of amplitudes of a portion of a reference signal and the storage registers of the reference and signal registers are placed in one-to-one correspondence as indicated by the alignment in FIG. 3 of a storage register 182 in reference register 180 with storage register 172 in signal register 168, by the alignment of a storage register 184 in reference register 180 with a storage register 174 in signal register 168, and by the alignment of a storage register 186 in reference register 180 with storage register 176 of signal register 168. In addition to the signal register 168 and reference register 180, the even correlator comprises a term-by-term multiplier 188 having a plurality of sections, such as the sections 190-194 indicated by dashed lines in FIG. 3, and an adder 196. Each section of the multiplier 188 is connected to the output terminals of a storage register in the signal register 168 and to the output terminals of the corresponding storage register of the reference register 180 and each section of the multiplier is a conventional multiplication circuit that multiplies the signal amplitudes in the storage registers to which the section is connected in response to a clock pulse delivered to the multiplier 188 on a clock path 178 that receives the pulses supplied to the octave circuit 22 on clock path 48. The adder receives the amplitude products on a bus 200, adds the products, and outputs the sum on a channel 202 in response to the clock pulse received by the octave circuit 22 on clock path 48 and transmitted to the adder via a clock path 204. Such sum provides the even part of a correlation signal between the reference signal and an arbitrary signal being received by the signal representation generator 20 to be associated with a cell in a time-frequency information plane representation of an arbitrary signal in a manner to be discussed below.

The odd correlator 154 differs from the even correlator 152 only with respect to the contents of the storage register of the reference register (not shown) that is included in the odd correlator 154 in the same manner that the reference register 180 is included in the even correlator 152. Where the reference register of the even correlator contains a sequence of amplitudes of an even part of a selected reference signal, the reference register of the odd correlator contains an equal number of amplitudes of an odd part of the reference signal as will now be discussed with reference to FIGS. 5 and 6 wherein is shown a representative wavelet from which reference signals are derived. As will be discussed below, an arbitrary signal impressed at the generator input terminal 44 is decomposed into a sum of such reference signals by the signal representation generator 20.

Figure 5:
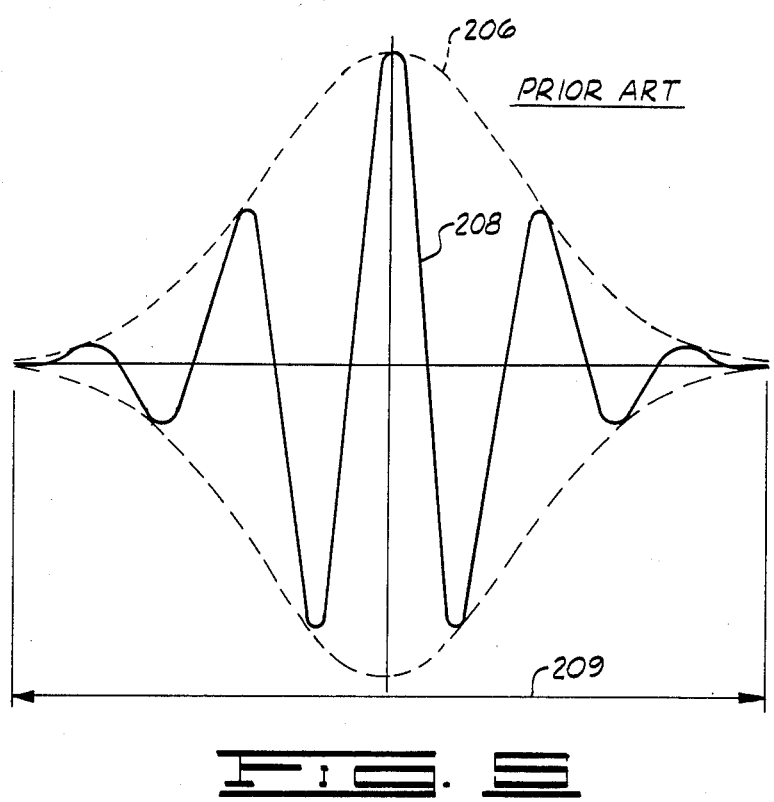
FIG. 5 is a diagram of the even part of a representative standard wavelet useful for generating a representation of a signal.
Figure 6:
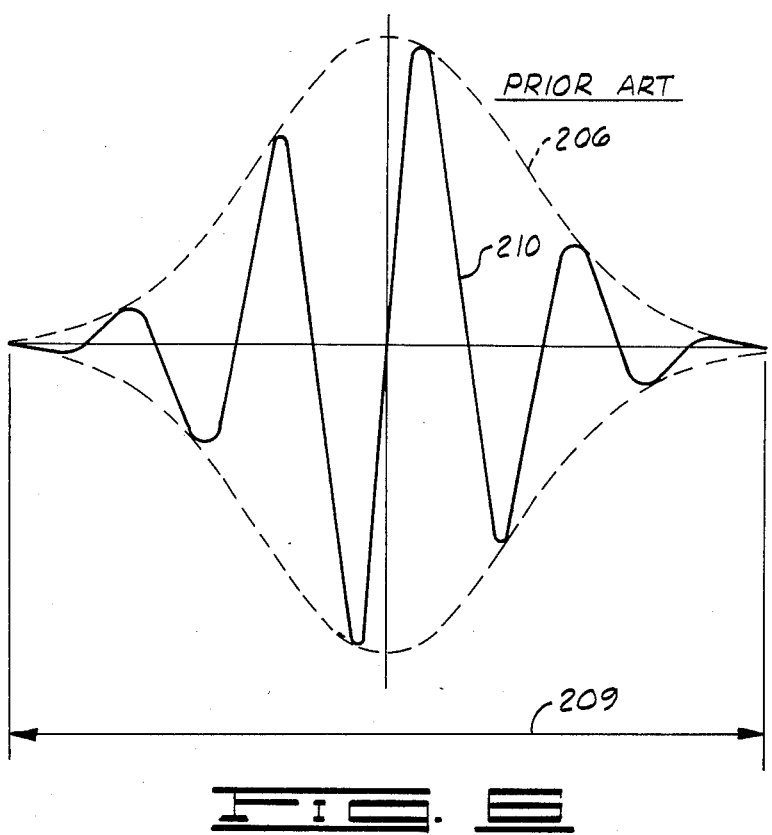
FIG. 6 is a diagram of the odd part of a representative standard wavelet useful for generating a representation of a signal.

The wavelet shown in FIGS. 5 and 6 has been taken from Morlet's publications and is a wavelet particularly suited for representing the information carried by a signal produced by a geophone. Such signal will usually contain short oscillatory pulses, comprised of only a few periods at various frequencies, and such pulses are indicative of reflections of an elastic wave from subterranean strata in the region in which the geophone signal is taken. Such form of the signal is carried into the wavelet so that the representation reproduced by the signal representation generator 20 reflects the phenomenon to which the geophone is responding.

In its general form, the wavelet has two parts, each of which is a sinusoid limited by an envelope which has an appreciable amplitude for only a few periods of the sinusoid so that a wavelet associated with one cell of the information plane on which an arbitrary signal is decomposed will contribute only in a minor way to the superposition of wavelets that represent an arbitrary signal in temporally adjacent cells. In FIGS. 5 and 6, such characteristic has been achieved by selecting the envelope, designated by the numeral 206 in FIGS. 5 and 6, to be a gaussian probability curve having a decay constant selected to effect a large reduction in the amplitude of the envelope over a displacement of two and one half cycles of the sinusoid from the center of the envelope. The two parts of the wavelet are indicated by the curve 208 in FIG. 5 and the curve 210 in FIG. 6. As can be seen in these Figures, the curve 208 is the result of limiting a cosine curve with the gaussian probability envelope, hence the curve 208 is an "even" part of the wavelet, and the curve 210 is the result of limiting a sine curve with the gaussian envelope, hence the curve 210 is an "odd" part of the wavelet.

The reference signals associated with the band circuits differ from the wavelet in that the wavelet is defined without regard to any frequency while the reference signal associated with each band is defined such that the sinusoidal part of the reference signal has the frequency associated with such band. Thus, each reference signal has the same form as the wavelet but has a time extent that differs from band-to-band while the wavelet has a length, indicated at 209 in FIGS. 5 and 6, that is defined by the number of oscillations of the sinusoidal part of the wavelet within the envelope 206. The use of a wavelet having even and odd parts defined in this manner, and the derivation of the reference signals by adjustment of the wavelet for band frequencies, preserves phase relationships found in the signal to be represented as a superposition of reference signals derived from the wavelet.

In the same manner that the frequencies to which the band circuits can be expressed analytically, the reference signals associated with each of the band circuits can also be expressed analytically for the gaussian limited wavelet shown in FIGS. 5 and 6. Such analytical expression, for the even and odd parts respectively of the reference signals derived from the gaussian limited cosine and sine curves shown in FIGS. 5 and 6, are given by the expression:

$$g_e(t) = \exp[-(f_{n,k}t)^2 \ln 2] \cos(2\pi f_{n,k}t) \quad (3)$$

and $$g_o(t) = \exp[-(f_{n,k}t)^2 \ln 2] \cos(2\pi f_{n,k}t) \quad (4).$$

Once a reference signal has been defined for each of the band circuits, such signal can be used to determine reference signal amplitudes for entry into the reference registers of the correlators for correlation with a signal introduced into the generator input 44. For this purpose, the wavelet length 209 is divided into a selected number of intervals and the amplitude of the wavelet at the end points of each of these intervals is determined. Such amplitudes are selected as the amplitudes of the reference signals to be introduced into the storage registers of the reference registers. (Such method of determining reference signal amplitudes will result in a scaling of the reference signals from band-to-band and such scaling must be removed when a signal that has been decomposed is reconstructed. The reconstruction is carried out by multiplying each of the correlation signals produced by the signal representation generator 20 by a constant determined for each frequency by requiring that the energies of reference signals so defined, and including the frequency of the reference signal, be the same for all frequency bands. Such energy is defined as the integral over the reference signal; that is, over the wavelet length 209, of the squares of the expressions given in equations (3) and (4) above.) Differing numbers of intervals for determining reference signal amplitudes are used for band circuits having different values of the index k as will be discussed below.

It will be noted that wavelets and reference signals, defined in this way will have both frequency and time characteristics. The decay of the envelope to a near zero value for a selected number of cycles provides the time characteristic of the wavelet and the sinusoidal variation of the wavelet provides the frequency characteristic. The combination of these characteristics in the wavelet makes the reference signals derived therefrom well suited for forming a representation of a signal associated with transient phenomena.

It should be noted that the wavelet shown in FIGS. 5 and 6 is only an exemplary form of wavelet that might be used in conjunction with the present invention. An important advantage of the present invention is that the wavelet can be selected to bring out phenomenological characteristics of a signal which is represented by the wavelets. For example, should the signal be that produced by a microphone placed to pick up sound waves produced in a piano recital, a more realistic envelope for the wavelet would have a maximum skewed toward one end of the wavelet to reflect the large initial amplitude, and subsequent slow decay, of a sound wave produced when a piano note is struck. An example of the even part of such a wavelet has been illustrated in FIG. 10 and designated by the numeral 207 therein. The skewing of the wavelet envelope 205 in FIG. 10 can be achieved by replacing $f_{n,k} t$ by $\ln f_{n,k}t$ in equations (3) and (4) above. Similarly, the number of oscillations contained within the envelope can be selected to meet the characteristics of a phenomenon under consideration. Thus, the important characteristics of the wavelet are not that it has one particular form; rather, the important factor is that it can be selected to realistically reflect the time and frequency characteristics of a signal associated with a transient phenomenon. (Another important characteristic of the wavelet is that it must not contain any energy at zero frequency (DC) and in the neighborhood of zero frequency.)

Referring once again to FIGS. 1-3, the general scheme of the construction and operation of the signal representation generator 20 can now be seen. Each octave circuit is associated with a particular octave of a frequency range that includes the frequency components of a signal to be represented by reference signals derived from wavelets, such range depending upon the phenomenon that produces the signal. The range for each octave circuit is further divided into bands, and a band circuit is included in the octave circuit for each of these bands. Each band circuit contains an even correlator and an odd correlator and each correlator includes a reference register that stores a sequence of amplitudes derived from an even or odd part of a standard wavelet; that is, a wavelet that decays to near zero values at end points of the wavelet defined by a fixed number of cycles of sinusoids that enter into the definition of the standard wavelet for all frequencies that might be associated with the wavelet. Such frequencies are the frequencies to which the band circuits respond.

Each band circuit also contains a bandpass filter to select a particular frequency component of a signal to be represented and an A/D converter to provide a digitized representation of such component each time the octave circuit receives a clock pulse. The digitized representations of the signal components are serially clocked into the signal registers of the correlators, one new amplitude of a signal component being entered into a signal register with each clock pulse delivered to an octave circuit and the oldest amplitude stored in a signal register being clocked out of the register so that, at any time, the reference and signal registers of each correlator will each contain a sequence of amplitudes that can be correlated by the multiplier and adder circuits of the correlator. Such correlations occur with each clock pulse delivered, according to the scheme shown in FIG. 4, to each of the octave circuits. The resulting signals, obtained by the correlation, are outputted on a channel to the multiplexer 58 and such channels have been indicated in FIG. 2 by the aforementioned channel 202 from the adder 196 of the even correlator 152 and by channels 212-226 for the remaining correlators of the octave circuit 22. These channels form the bus 66 in FIG. 1 and the buses 68-74 from the remaining octave circuits similarly comprise a plurality of channels upon which even and odd parts of correlation signals are impressed with each clock pulse provided to each octave circuit. The counter 62 also receives clock pulses and selects, for each clock pulse delivered to the counter on clock paths 60 and 64, a particular pair of even and odd correlation signals, such signals being provided by one band circuit, to be passed by the multiplexer for recordation.

In order to use the signal representation generator 20 as an analytical tool, the correlation signals generated and recorded by the signal representation generator 20 are referred to a grid on the information, or time-frequency plane. The grid corresponding to the described embodiment of the signal representation generator has been illustrated in FIG. 8. An important aspect of the present invention is the structure of this grid, such structure being a major factor which has enabled the concepts of Gabor and Morlet to be embodied in circuitry to make the present invention possible. Before discussing this grid, it will be useful to consider the problem which, until the present invention, prevented the practical application of the theory that was developed by Morlet upon the suggestion initially made by Gabor. Such problem has been solved by dividing the information plane into a grid such as that shown in FIG. 8 and by constructing the signal and reference registers of the correlators in a manner that is consistent with the grid shown in FIG. 8.

The information or energy content of a signal is continuously distributed in the time-frequency (information) plane. When a discrete representation of this distribution is desired, proper sampling of this content over the plane is necessary to preserve the information distribution. This sampling is defined over a grid of points which are centers of small domains of the plane, called cells. In order to represent the information of the signal most compactly and accurately, the uncertainty principle requires that the sampling of the time-frequency representation of the signal be done at a rate of one sample per cell in a grid made of cells of equal area, this area being chosen to avoid both oversampling and undersampling.

Should the information plane be decomposed on frequencies defined by numbers of octaves and times defined by numbers of cycles in a periodic wave, a representation of an arbitrary signal in terms of reference signals associated with each cycle-octave cell would generally contain much less information than is available in the signal itself because of undersampling. Accordingly, to obtain the maximum information present in the signal, the cells are further subdivided in one or both of the time and frequency domains. In order to minimize oversampling and to obtain a practical grid, it has been found that the maximum information available in the signal can be obtained when the product of the number of divisions of the octaves in the frequency domain and the number of divisions of the cycles in the time domain is equal to eight. For example, for the reference signals shown in FIGS. 5 and 6, a maximum information representation can be achieved by dividing each octave in the frequency domain into four frequency bands, as has been done in the described embodiment of the invention, and by dividing the wavelet length 209 in FIGS. 5 and 6 into ten units each so that one half cycle of a sinusoid in a wavelet would be the time unit upon which the representation of the signal is constructed. Thus, there would be two cells per cycle of the wavelet and four bands per octave of frequency resulting in the desired product 8.

The difficulty with defining an information plane grid with cells of equal area and equal octave width as shown in FIG. 7, indeed, the difficulty that prevented practical implementation of the theory prior to the present invention, is that time scales defined to be a selected number of periods of reference signals corresponding to different frequency bands defined on an octave scale cannot be rationalized with clocks necessary to implement a practical device. For example, the ratio between successive logarithmic centers of frequency bands in an octave, where four bands per octave are used to establish the information plane grid, is proportional to the fourth root of two, an irrational number. This irrationality would be carried into the time scales for the different bands by making the time scale for each band extend in time by an amount that is a selected fraction of a reference signal having a sinusoidal portion defined by the frequency of the band. Thus, should a time scale be developed in real time to carry out the decomposition of an arbitrary signal in terms of reference signals using the original cycle-octave grid structure developed by Morlet, in which the time extent of each cell in the information plane grid is inversely proportional to the frequency of the band in which the cell is disposed, the resulting irrational numbers would lead to increased computing time and unacceptable costs which would make this technique impractical. The further theoretical development referred to above that enables the theory to be practically implemented eliminates the difficulties arising from the spacing of cells in different frequency bands in irrational ratios.

Figure 8:
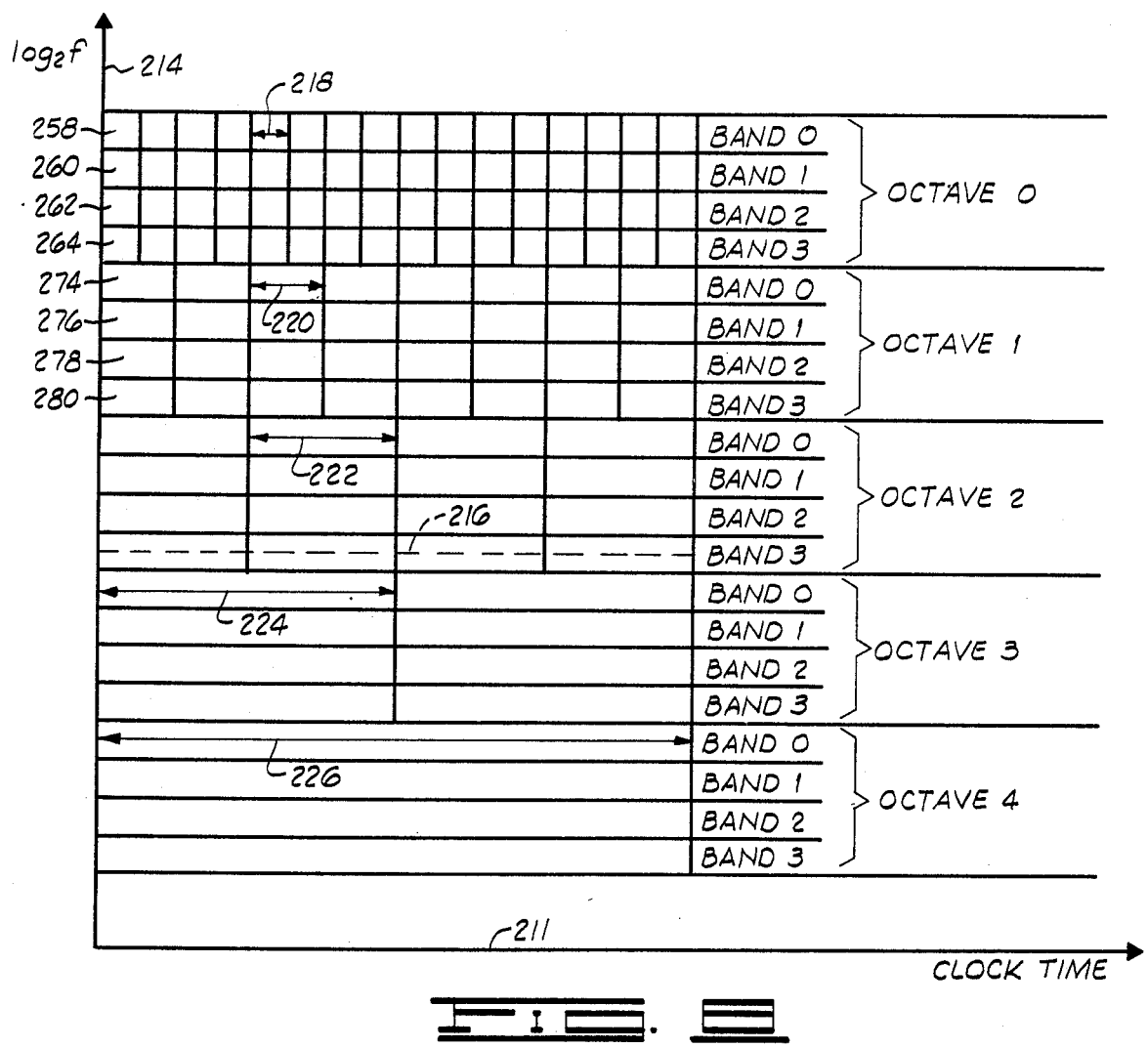
FIG. 8 is a diagram of the information plane divided in accordance with the present invention.
Figure 10:
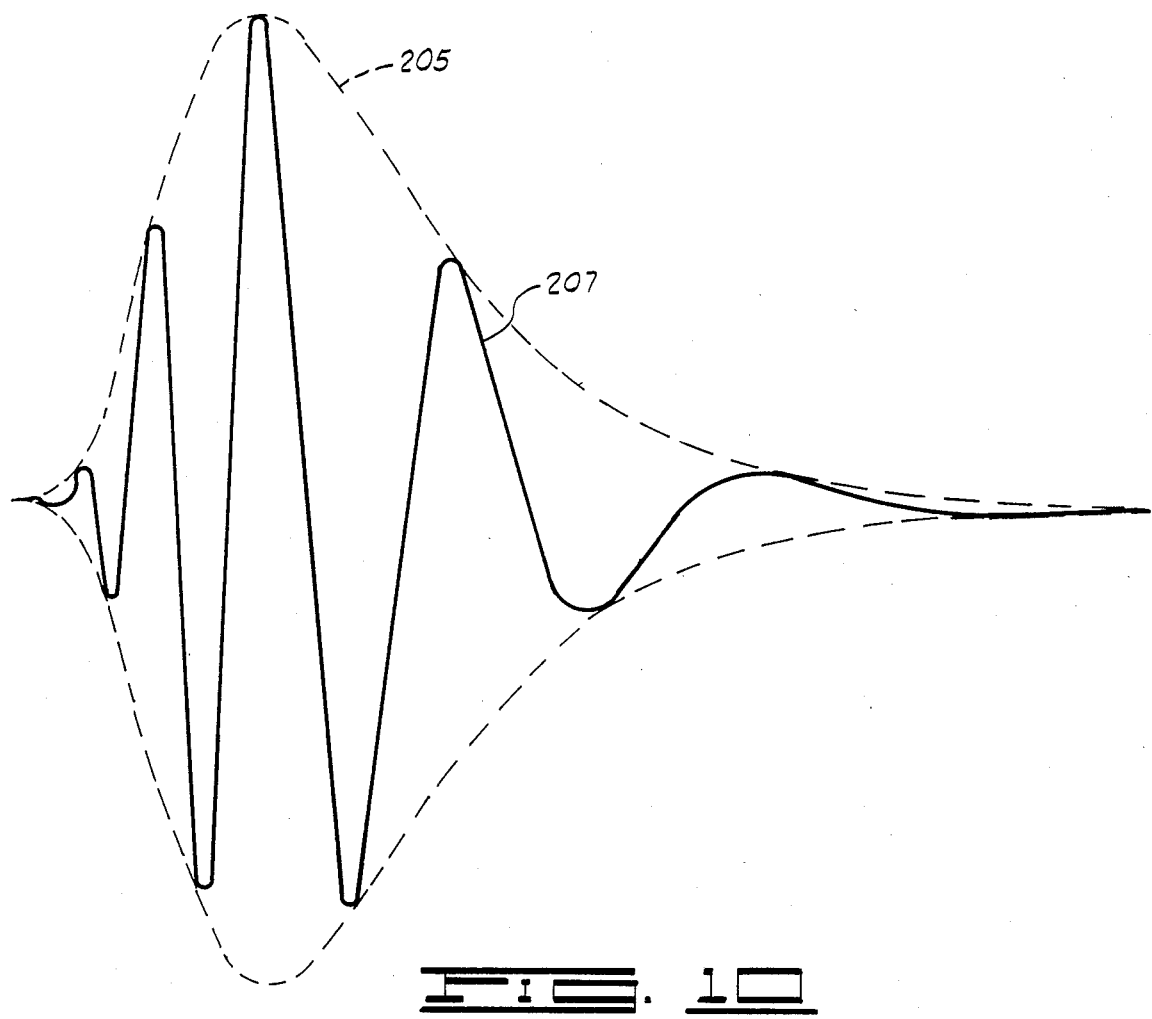
FIG. 10 is a second form of the even part of a standard wavelet useful for generating a representation of a signal.

In the present invention, the modified information plane grid shown in FIG. 8 is utilized to effect a decomposition of an arbitrary signal as a sum of reference signals and such grid is made up of cells having time extents which differ by factors of two from octave to octave and are equal for all bands in an octave. Such structure of the grid enables a representation of an arbitrary signal in reference signals to be practically implemented by the clocking of octave circuits at different rates, related by powers of two, as has been discussed above with respect to FIG. 4. In order to achieve this practical implementation of the theory, the correlation of signal components for different bands of an octave with the reference signal is carried out slightly differently for each of the bands of an octave in a manner that has been indicated in FIG. 9. The net effect of the choice of the information plane grid of FIG. 8 and the differences in the manner in which a signal component is correlated with a reference signal result in slightly higher sampling rate when computing the correlation values in the lower bands of each octave. Nevertheless, these correlation values, in their totality, and with reference to the information plane grid, express a representation of an arbitrary signal while removing the difficulties in obtaining such a representation. The corresponding discrete representation is valid provided that appropriate compensation for oversampling be applied in the reconstruction of the signal as will be discussed below.

Referring first to FIG. 8, shown therein is an information plane grid suitable for use with a signal representation generator which includes five octave circuits, each of which includes four band circuits. The information plane in such case is defined by a time axis 211 and a frequency axis 214. The times plotted on the time axis 211 to define a grid of cells in the information plane are clock times, such as can be determined by the clock 46, and the quantities plotted on the frequency axis 214 are logarithms of the frequencies passed by the collection of filters of the signal representation generator 20 where such logarithms are taken to the base two. The frequency axis 214 is divided into a plurality of octaves, corresponding to the octave circuits 22–30, covering the frequency range of interest and such octaves are numbered, beginning with zero, from the octave describing the highest frequency portion of the frequency range of interest consistently with the above described numbering of the octave circuits using the index n. Each octave is further divided into bands, corresponding to the band circuits of each octave, which are similarly numbered beginning with zero at the top of the octave, consistently with the above described numbering of the band circuits using the index k, and such numbering has been shown in FIG. 8 for the case in which a frequency range is divided into five octaves of four bands each. The bands and octaves thus divide the information plane into a series of strips parallel to the time axis with each strip being logarithmically centered on one of the frequencies passed by one of the filters of the signal representation generator 20. Thus, for example, using the indices n and k to identify a particular band circuit of a particular octave circuit as described above, the logarithmic center of the frequency band passed by the filter in the third band circuit of the second octave circuit would be the frequency $f_{2,3}$ indicated by the dashed line 216 in FIG. 8.

Within each octave, the information plane grid is divided into equal time intervals which, unlike the time intervals described by Morlet, are the same for all bands in the octave. In particular, such time interval is selected to be the time interval defined by Morlet for the highest frequency band in the octave. That is, for each band defined by the indices n, k, described above, the time interval is selected to be given by the equation:

$$\Delta t_{n,k} = \frac{1}{C f_{n,0}}, \qquad (4)$$

where C is the number of cells to be selected for each cycle of a reference signal. For example, if two cells per cycle of the reference signal are selected, as would be the case when each octave is broken into four bands as discussed above, the number C would be two. Such time interval differs from the time interval defined for the information plane grid discussed by Morlet in that Morlet selected the time interval for each cell of a band defined by the indices n and k to be proportional to the inverse of $f_{n,k}$ rather than $f_{n,0}$.

Since the frequencies associated with the highest bands in each of the octaves form a sequence in which the frequency is halved for a unit increase in the index n identifying the octave in which a band is disposed, the time intervals used to define the information plane grid in FIG. 8 double from one octave to another as shown by the time intervals indicated by the numerals 218-226 in FIG. 8. That is, the time intervals indicated by these numerals, for octaves of successively decreasing frequency, are in the ratio of 1:2:4:8:16. Such a scheme would be continued should the signal representation generator 20 contain additional octave circuits so that the information plane would be divided, with respect to frequency, into additional octaves. Thus, the temporal extents of the cells in the information plane, for all bands of the plane, are in ratios of whole numbers so that times at which correlation signals are generated by the correlators of the octave circuits can be related to particular pulses produced by the clock. In particular, these ratios of whole numbers are incorporated into the clock 46 by the clocking of different octave circuits at different rates, differing by factors of two, as has been shown in FIG. 4. Accordingly, the adoption of the information plane grid shown in FIG. 8 permits a practical measure of time which is necessary for the decomposition of a signal into a sum of reference signals derived from a standard wavelet.

However, the effect of modifying the information plane grid from the grid proposed by Morlet (that is, a grid in which time intervals are defined for each band and differ for each band in accordance with the frequency associated with the band) to the grid shown in FIG. 8 (that is a grid in which time intervals are defined for each octave but are the same for all bands in an octave) is that the correlation values defined by Morlet no longer apply. FIG. 9 illustrates the manner in which different sampled values of the reference wavelets corresponding to small changes in sampling rate can be obtained to derive a correct correlation and thereby obtain a valid representation of the signal to be achieved while associating such values with the practical information plane grid shown in FIG. 8.

In FIG. 9, the even part 208 of the standard wavelet shown in FIG. 5 has been reproduced along with wavelet lengths, similar to the wavelet length 209 shown in FIG. 5, that are associated with individual band circuits in an octave circuit. That is, the wavelet length 228 shown in FIG. 9 is a wavelet length for a band having an index k=0; the wavelet length 230 is a wavelet length for a band having an index k=1; the wavelet length 232 is a wavelet length for a band having an index k=2; and the wavelet length 234 is a wavelet length for a band having an index k=3. It should be noted that these lengths, when related to a particular band circuit also define a time duration for the reference signal stored in reference registers of the band circuit because of the inclusion of the frequencies associated with the band in the reference signals. These time durations generally differ from time durations of cells in the information plane. The time durations of the cells are related to a number of periods or fractions of a period of the reference signal having the frequency associated with the band in which the cell is disposed. As noted above, the correlation signals used to represent an arbitrary signal impressed at the generator input 44 are found by correlating the amplitude of a signal component passing through a filter in a band circuit with the amplitude of a reference signal derived from the standard wavelet length and stored in the reference registers of the correlators of the band circuit. Correlation signals good enough to provide an accurate representation of a signal as a sum of reference signals can be obtained, using the practical information plane grid shown in FIG. 8, by dividing the wavelet lengths for different bands into different numbers of reference signal intervals, hence the illustration of a plurality of wavelet lengths corresponding to different bands in FIG. 9. In particular, the shortening of the cells corresponding to higher band indices that occurs when the practical sampling grid of FIG. 8 is adopted in place of the sampling grid proposed by Morlet can be offset by using differing numbers of reference signal intervals in correlating signal components in different bands with reference signals derived from the standard wavelet. FIG. 9 illustrates the manner in which the use of different numbers of reference signal intervals, for different bands in each octave, is carried out.

Initially, for a band having an index k=0, a selected number of reference signal intervals is chosen so that a selected number of wavelet amplitudes can be determined to obtain a sequence of reference signal amplitudes to be entered into the reference registers of the correlators for correlation with different frequency components of a signal to be represented. In FIG. 9, for simplification, it has been assumed that ten such intervals are selected for each band circuit identified with the index k=0 and such intervals have been marked on the k=0 band wavelet length 228. (This small number of intervals would not be satisfactory for an accurate evaluation of the correlation signal because of undersampling. In a practical embodiment of the signal representation generator, a larger number of intervals would be defined on the wavelet length 228 in a manner and for a purpose to be discussed below.) For each end point of each of these intervals, the even part of the reference signal will have a well defined amplitude as indicated, for example, by the point 236 in FIG. 9 corresponding to a shift of one interval from the center of the reference signal. The amplitudes found by the intervals defined for the wavelet length 228 corresponding to the band index number k=0, and for the even part of the reference signal, would be entered into the storage registers of the even correlators of band circuits assigned the index k=0. Similarly, reference signal amplitudes for the odd correlator reference registers in band circuits identified by the index k=0 would be found by using the breakdown of the wavelet length 228 in FIG. 9 with the odd part of the standard wavelet.

In order to obtain an accurate representation of an arbitrary signal with the practical sampling grid shown in FIG. 8, the wavelet lengths associated with remaining frequency bands of each octave are divided into a different number of reference signal intervals as has been shown in FIG. 9. Thus, for the case in which the signal representation generator contains four band ciruits per octave circuit and ten reference signal intervals are used to obtain reference signal amplitudes for the reference registers of the correlators of the k=0 band circuits, twelve reference signal intervals would be used to obtain wavelet amplitudes, and thence reference signal amplitudes, for reference registers in k=1 band circuits; fourteen intervals would be used to obtain amplitudes for the reference registers in k=2 band circuits and sixteen reference signal intervals would be used to obtain amplitudes for the reference registers in k=3 band circuits. Such increase in the number of reference signal intervals associated with different band numbers has been shown in FIG. 9 by the division of the wavelet lengths 230, 232 and 234 respectively and the points 238, 240 and 242 indicate amplitudes that would be selected from the even part of the reference signal shown in FIG. 5 for a shift of one reference signal interval from the center of the wavelet. The sets of amplitudes of the even part of the wavelet 208 corresponding to the divisions of the wavelet lengths 230, 232 and 234 would be entered into the reference registers of the even correlators of the band circuits identified by the numbers 1, 2 and 3 respectively for the band index k. A similar set of reference signal amplitudes would be determined from wavelet amplitudes similarly picked from the odd part of the standard wavelet and entered into the reference registers of the odd correlators.

While the above description applies to the special case in which each octave circuit of the signal representation generator includes four bands and ten reference signal intervals are selected to determine, for the $k=0$ bands, the wavelet amplitudes to be entered into the reference registers of the correlators as reference signal amplitudes, the scheme can be generalized to provide for the determination of the reference signal amplitudes to be entered into the reference registers of the correlators of a signal representation generator having any number of band circuits included in each octave circuit and for any number of reference signal intervals chosen for the $k=0$ band. In general, the number of reference signal intervals used to pick amplitudes of the standard wavelet for determination of reference signal amplitudes to be entered into the reference registers is the nearest whole number less than the quantity $N_k$ given by the expression $$N_k = N_0 2^{k/K} \tag{5},$$

where $N_0$ is the number of reference signal intervals used to find reference signal amplitudes for the $k=0$ band circuits, k is the band circuit index number k associated with a band circuit as discussed above, and K is the number of band circuits in each of the octave circuits of the signal representation generator.

FIG. 9 was drawn for the special case in which it was assumed that the $k=0$ band would be divided into ten reference signal intervals in order to find amplitudes of the standard wavelet for deriving reference signal amplitudes to be entered into the reference registers comprising portions of the band circuits. Such number of reference signal intervals was chosen only for clarity of illustration of the manner in which the reference signal amplitudes are found for each of the band circuits in each of the octave circuits of the signal representation generator. However, this small number of intervals is not satisfactory for correlation accuracy and it is contemplated that many more reference signal intervals will be used in order to maximize the accuracy with which the correlations carried out by the correlators is effected. A particularly useful number of reference signal intervals is related to the number of band circuits to be included in each octave circuit as will now be described.

As noted above, the time extent of each cell of the information plane will correspond to a particular number of cycles or fractions of cycles of a reference signal at the frequency of the band in which the cell is disposed. In the example given above, each octave circuit comprises four band circuits so that, as discussed above, each cell of the information plane grid shown in FIG. 8 would have a time duration of one half the period of a periodic wave having the frequency of the band in which the cell is disposed. For example, if the uppermost frequency band shown in FIG. 8 is centered on a frequency of 250 hertz, so that the period associated with such uppermost band is four milliseconds, the time duration of the cells in the uppermost band would be two milliseconds. Thus, by correlating the highest frequency component of the signal being represented with the reference signal amplitudes stored in the reference registers of the highest frequency band circuit of the signal representation generator at two millisecond intervals, one could obtain a correlation signal to be associated with each cell of the uppermost row of cells in FIG. 8. However, it is also possible to carry out the correlations at a higher rate and select only one of a series of correlation signals thus obtained to be associated with each cell of the uppermost row of cells in the information plane shown in FIG. 8. However, the additional correlation signals are not needed to obtain an adequate sampling of the representation. They would not add to the information content of the representation and therefore it is not essential that they be obtained. This point can be used to facilitate the multiplexing of the correlation signals as will now be explained.

As will be clear from the above description of the construction of the signal representation generator 20, the clock pulses received by the octave circuits define sampling times, separated by selected sampling time intervals, for signal components passed by the filters in the band circuits. Each time an octave circuit receives a clock pulse, the A/D converters of each of the band circuits in the octave circuit will sample the signal component to which the band circuit responds and for selected pulses of the clock the correlators of the band circuit will generate a correlation signal, forming a part of the representation and having even and odd components, that is related to a segment of the signal component to which the band circuit responds. This segment is equal in time extent to the product of the sampling time interval for the band circuit and the number of storage registers in the signal registers of each of the correlators of the band circuit. Thus, the rate at which correlation signals are produced by the correlators is determined by the rates at which the octave circuits are clocked and the appropriate selection of the pulses of the clock as described below.

In order to relate these correlation signals to the grid of the information plane, it is necessary to select one or more of the sampling time intervals to correspond to the time extent of a cell, at the frequency to which each particular band circuit responds, in the information plane. That is, it is necessary to define a correlation time interval, comprised of one or more sampling time intervals from the rates at which each of the band circuits are clocked and then make such correlation time interval the same as the time extent of a cell in the information plane. While such correlation time interval must include at least one sampling time interval to carry out the representation of an arbitrary signal over the information plane, it can also be any selected number of sampling time intervals. A particularly suitable number of sampling time intervals to make up a correlation time interval is the number of band circuits in an octave circuit. That is, the sampling time interval for each octave circuit is made to be a fraction of the time extents of the cells corresponding to that octave circuit such that K correlation signals are produced by each of the band circuits of an octave circuit for each cell of the octave of the information plane to which the octave circuit corresponds, where K is the number of band circuits of an octave circuit. The channels from the correlators of the band circuits included in the octave circuit are then connected to different input terminals of the multiplexer so that, as the multiplexer receives signals from the counter to select a correlation signal from a particular octave circuit to be passed by the multiplexer, the even and odd correlation signals from different band circuits of the octave circuit are selected in turn to be transmitted by the multiplexer. By this means, one correlation signal from each band circuit is passed by the multiplexer and recorded for each correlation time interval defined by a series of pulses received by an octave circuit and selected to be equal to the time extent of a cell in the information plane. Thus, each time a clock pulse is delivered to an octave circuit, all band circuits in the octave circuit generate correlation signals but only one correlation signal is selected for recording so that a series of clock pulses will result in a correlation signal being generated and recorded for each cell of the information plane by selecting the correlation signal to be recorded from each octave to be one of the correlation signals generated by one of the band circuits of that octave. This scheme has been illustrated in FIG. 4 for the series of pulses transmitted to the first octave circuit of the signal representation generator illustrated in FIG. 1.

In FIG. 4, the correlation time interval for the first octave circuit has been indicated at 244 and, as shown in the Figure, four pulses are delivered to the first octave circuit 22 during the interval 244. Such number of pulses corresponds to the four band circuits that are included in each of the octave circuits of the embodiment of the invention shown and is selected by selection of the basic clock rate indicated on axis 60 of FIG. 4. That is, once the length of the correlation time interval has been selected, by selecting the information plane grid for representation of a signal, the sampling time interval for the first octave circuit is selected to have a period equal to the time extent of the cell in the first octave of the information plane divided by the number of band circuits included in each octave circuit. In the example above, wherein each cell in the uppermost octave is to have a time extent of two milliseconds, the clock rate for the first octave circuit would thus be 2,000 hertz; i.e., the period of the clock pulses delivered to the first octave circuit would be two milliseconds divided by four or 0.5 milliseconds. The clock rate for the multiplexer and counter, indicated on axis 60 of FIG. 4, would therefore be 4,000 hertz.

In order to multiplex the correlation signals to relate one signal to one cell of the information plane, the channels 202 and 212 in FIG. 2 would be connected to one set of input terminals of the multiplexer 58 corresponding to one number at the data selection terminals of the multiplexer 58; the channels 214 and 216 would be connected to another set of input terminals of the multiplexer 58 corresponding to another number at the data selection terminals of the multiplexer 58; the channels 218 and 220 would be connected to a third set of input terminals of the multiplexer 58 corresponding to a third number at the data selection terminals of the multiplexer 58; and the channels 224 and 226 would be connected to a fourth set of input terminals of the multiplexer corresponding to a fourth number at the data selection terminals of the multiplexer. Moreover, the sets of input terminals to which these channels would be connected would be input terminals that correspond to numbers at the data selection terminals of the multiplexer given in accordance with equation (1) above. Thus, with the first pulse delivered to the counter 60 by the clock 46, such pulse indicated at 246 in FIG. 4, the correlation signal produced by the k=0 band circuit 84 of the n=0 octave circuit would be transmitted by the multiplexer and recorded. The third, fifth, and seventh pulses, indicated at 248–252 respectively in FIG. 4 would similarly result in the recordation of the correlation signals produced by the band circuits 86, 88 and 90 respectively in FIG. 2. Since each of the clock pulses indicated at 246–252 in FIG. 4 occurs within one correlation time interval corresponding to the time extent of one cell in the information plane grid, the series of correlation signals so recorded would be correlation signals for the first column of information plane grid cells in the uppermost octave shown in FIG. 8. That is, the correlation signal recorded with reception of the pulse 246 by the counter 62 would be an appropriate correlation signal for the cell 254 in FIG. 8; the correlation signal recorded for the pulse 248 would be appropriate for the cell 260 in FIG. 8; the correlation signal recorded for the pulse 250 would be appropriate for the cell 262; and the correlation signal recorded for the pulse 252 would be appropriate for the cell 264 in FIG. 8. The channels from the correlators of the band circuits in the first octave circuit would also be connected to input terminals of the multiplexer corresponding to higher odd numbers to be impressed at the data selection terminals of the multiplexer, in accordance with equation (1) above, so that a subsequent set of clock pulses delivered to the counter would cause correlation signals corresponding to the next column of information plane cells to be transmitted to the recorder and recorded.

In the same manner that one set of pulses delivered to the first octave circuit over a correlation time interval equal to the time extent of a cell in the first octave of the information plane causes each of the correlation signals delivered by each of the band circuits in the first octave circuit to be recorded, the same number of pulses delivered to the second octave circuit would result in recordation of correlation signals for one column of cells in the second octave; that is, the octave for which the index n is equal to one corresponding to a similarly indexed octave circuit; and the band circuits of the second octave circuit would be connected to appropriate sets of input terminals of the multiplexer 58, again in accordance with equation (1) above, so that the second, sixth, tenth and fourteenth pulses delivered to the counter, such pulses indicated at 266–272 in FIG. 4 would result in the recordation of correlation signals produced by the band circuits of the second octave circuit and appropriate to the cells 274–280 of the information plane shown in FIG. 8. The correlation signals produced by the remaining octave circuits would be similarly recorded.

It will be noted that only one correlation signal produced by the second octave circuit would be recorded for every two correlation signals from the first octave circuit that are recorded because of the halving of the rate at which pulses are delivered to the second octave circuit with respect to the rate at which pulses are delivered to the first octave circuit. Such halving of the clock rate to the second octave circuit thus defines a correlation time interval for the second octave circuit which is twice the correlation time interval 244 for the first octave circuit as indicated at 282 in FIG. 4. Such doubling of the correlation time interval between octave circuits corresponds to the doubling of the time extents of the cells in different octaves of the information plane as indicated by the time extents of the cells 274–280 with respect to the time extents of the cells 258–264 in FIG. 8. Thus, by utilizing the clocking scheme shown in FIG. 4 and expressed analytically in equation (1), the signal representation generator 20 will generate and record one correlation signal between one frequency component of an arbitrary signal and a reference signal derived from the standard wavelet for every cell of the information plane. By this means, the signal representation generator generates and records correlation signals for all cells of a selected information plane grid and it can be shown that such correlation signals are, after scaling as discussed above, appropriate coefficients for summing wavelets, each having frequency and time characteristics associated with a particular cell in the information plane, taken over all cells of the plane.

As has been noted above, the number of reference signal intervals into which the wavelet length corresponding to the index $k=0$ is divided; that is, the value of $N_0$ in equation (5), must be much larger than the ten intervals that were shown in FIG. 9, to ensure accuracy of the correlation. A suitable number for the wavelet shown in FIGS. 4 and 5 is forty. Such number is chosen on the basis that, generally, the period of the sinusoidal part of the wavelet has to be divided into eight intervals to obtain accurate correlation signals for the representation. Thus, for the wavelet shown in FIGS. 4 and 5 in which the envelope 206 contains five periods, the number of intervals into which the wavelet length has to be divided is forty, leading to forty-one wavelet amplitudes to be entered into the reference registers of the $k=0$ band circuits. This division of the length of the wavelet defines the rate at which clock pulses should be sent to the octave circuits to control the rates at which the A/D converters provide amplitudes of signal components to be entered in the signal registers. Such division corresponds to the octave circuit which contains the registers being clocked at a rate of four clock pulses per cell of the information plane. In such case, since the correlation time interval extends over four clock pulses, four new amplitudes of a signal component would be entered into the signal register for each cell of the information plane so that, if the wavelet is forty cells long, forty values of the amplitude of a signal component would be required to effect a correlation of the signal component with the entire reference signal. Thus, the signal register in a correlator, for this case, would have to contain at least forty storage registers and at least forty amplitudes of the reference signal would be contained in the corresponding reference register. Such number of amplitudes could be obtained by dividing the wavelet into forty reference signal intervals and selecting the amplitude of the wavelet at the center of each interval for determination of a sequence of reference signal amplitudes. However, it is preferred to use the end points of the reference signal intervals to determine the reference signal values to be entered into the reference register in order to include a point at the center of the wavelet for correlation. Thus, forty one, rather than forty, storage registers would be included in the reference and signal registers of a $k=0$ band circuit. A larger number of intervals, as given by equation (5) above, is then used for each of the other band circuits to effect the approximate correlation of signal components associated with the other bands that has been described above and that is used to permit the information plane to be divided into cells of equal extents, in clock time rather than wavelet cycle time, in each octave of the information plane.

Operation of the Signal Representation Generator

An important advantage of the signal representation generator 20 is that it can be utilized to provide a signal representation that is consistent with the phenomenon that produces the signal to be represented. In particular, the signal representation generator can include substantially any number of octave circuits so that a signal having frequency components in substantially any range can be represented and, the form of the representation can be varied via the selection of the form of the standard wavelet and the number of band circuits included in each of the octave circuits. In order to provide a complete understanding of the invention, it will be useful to briefly discuss the manner in which the number of octave circuits, the number of band circuits per octave circuit and the form of the wavelet would be selected to carry out the operation of the signal representation generator.

Initially, for any given signal to be represented, the phenomenon that produces the signal would determine the frequency range of the signal and such frequency range would be utilized to select the number of octave circuits to be included in the signal representation generator 20 as follows. The highest frequency component of the signal would be utilized to determine the logarithmic center frequency of the highest frequency band in the octave circuit associated with the highest frequency portion of the frequency range of the signal. This highest frequency would be divided successively by the number two until a frequency below the range of interest is obtained and the number of divisions required to obtain such low frequency would specify the number of octave circuits to be included in the signal representation generator. Thus, if the frequency range extends from approximately 250 hertz to approximately 15 hertz, five octave circuits would be utilized as has been illustrated in the drawings.

In addition to knowing the frequency range of interest from the phenomenon that produces the signal, the user of the signal representation generator would also know the form of transients that occur in the signal and such form would be utilized to select a standard wavelet in terms of which the signal representation is to be carried out. Such wavelet will have both time and frequency characteristics which duplicate the time and frequency characteristics of transients occurring at different frequencies in the signal and such characteristics are incorporated into the wavelet by selecting a wavelet envelope and a number of oscillations of a sinusoid to be included within the envelope. The resulting oscillatory character of the wavelet provides the wavelet with a frequency characteristic and the number of oscillations included within the envelope provides the wavelet with a time characteristic that corresponds to the frequency characteristic of the wavelet. Thus, in the situation in which the signal is produced by a geophone, a wavelet shape having both time and frequency characteristics that would be well suited to representing the geophone signal would be a wavelet in which the envelope is a gaussian probability curve that has appreciable values over approximately five periods of a sinusoid as has been illustrated in FIGS. 5 and 6. The distribution in time and frequency of the selected standard wavelet is the main determining factor for selection of the grid because it is clear that the shape of each cell should be close to that of this distribution. In other words, the grid used for the representation must be fitted to the time frequency distribution of the selected standard wavelet. But, in all cases, the standard wavelet must contain no energy in the neighborhood of zero frequency.

Once the number of octave circuits to be included in a signal representation generator 20 has been determined and the shape of the wavelet has been selected, the user of the signal representation generator will select an information plane grid which will enable the representation to be meaningfully interpreted once the representation has been obtained. In making such selection, the user can stress either time or frequency characteristics of the signal by selecting the number of band circuits to be included in each of the octave circuits of the signal representation generator. Thus, if the frequency characteristics are to be stressed, each octave circuit would include a large number of band circuits to divide the information plane into a large number of frequency bands which are divided into cells having relatively long extents in time. To stress the time characteristics, fewer frequency bands per octave would be used and the time extents of the cells would be correspondingly shorter. Such division of the information plane is carried out by requiring that the product of the number of bands per octave and the number of cells per period of the wavelet be equal to eight for reasons that have been noted above. For example, should the frequency characteristics be a primary concern and the wavelet contains forty cycles, the time extents of the cells could be made equal to four cycles of the wavelet so that the information plane would contain one fourth cell per cycle. Thirty-two band circuits would then be used in each octave circuit so that the product of thirty-two band circuits and one fourth cell per cycle would equal to the number eight. Conversely, should it be desired to stress the time characteristics of the signal, the user might choose three bands per octave so that the time extents of the cells in the information plane would be equal to two and two thirds of a wavelet cycle to again obtain the product eight. Once the number of band circuits per octave circuit has been chosen to stress one or the other of these characteristics, the logarithmic center frequencies of all of the bands of the information plane are determined as has been discussed above with reference to FIG. 7. In addition, the time extents of the cells of the information plane in each octave are determined from the frequency associated with the uppermost band in the information plane and the number of cells per cycle of the standard wavelet. Such determination is carried out by finding the period corresponding to the uppermost frequency band in the information plane and then dividing such period by the number of cells to be included within each period of the wavelet. For example, if the maximum frequency to be utilized in carrying out the representation is 250 hertz, corresponding to a period of four milliseconds, and two cells are to be established for each octave of the information plane, the cells in the uppermost octave would each have a time duration of two milliseconds. Cells in successively lower frequency octaves of the information plane would have time extents found by successively doubling the time extent so found for the uppermost octave of the information plane.

Once the information plane has been established, the rate at which the counter and, accordingly, the rates at which the octave circuits are to be clocked is determined from the time extent of the cells in the uppermost octave of the information plane and the number of band circuits to be included in each octave circuit. The rate at which the counter is to be clocked is found by multiplying the number of band circuits per octave circuit by the inverse of the time extent of the cells in the uppermost octave, to obtain the appropriate clocking rate for the octave circuit associated with the highest portion of the frequency band, and such number is then further multiplied by two to provide the doubling of the rate at which the counter and multiplexer are clocked with respect to the clocking of such octave circuit that has been illustrated in FIG. 4. This defines a master clock rate; that is, the rate at which the multiplexer is to be clocked as indicated on the axis 60 of FIG. 4. Thus, for example, if the signal representation generator includes four band circuits per octave circuit and the time extent of the cells in the uppermost octave of the information plane is two milliseconds, the basic clock rate for the signal representation generator 20; that is, the clock rate for the counter 62 and multiplexer 58, would be four times five hundred (the inverse of two milliseconds) times two. That is, the clock rate selected for the counter 62 and multiplexer 58 would be 4,000 hertz.

Next, an appropriate subset of the pulses transmitted to the multiplexer is selected for transmission to each of the octave circuits, in accordance with the principles discussed above, to control the sampling rate of the A/D converters in order to obtain the appropriate number of divisions of each period of the reference signal for the k=0 band circuit. Preferably, such selection will provide eight divisions per period of the reference signal. The number of storage registers in each of the reference and signal registers of the band circuits for the index k=0 is then the selected number of divisions per period of the reference signal multiplied by the number of periods of the sinusoid under the envelope of the standard wavelet plus one. Thus, for example, if the information plane is to contain two cells per cycle of a five cycle wavelet, the wavelet would be divided into forty reference signal intervals for all k=0 bands. Accordingly, the number of storage registers in the reference and signal registers of each of the highest frequency band circuits in the octave circuits would be forty-one. The reference signal amplitude to be stored in such registers would then be determined, as described above, by determining the amplitude of each of the even and odd parts of the wavelet at the ends of each of the reference signal intervals and entering such amplitudes into the storage registers for such highest frequency band.

The number of storage registers in the signal and reference registers of the remaining band circuits, and the reference signal amplitudes to be stored in the storage registers of the reference registers of such circuits would then be found by choosing a different number of reference signal intervals for each of the other band circuits according to equation (5) above. Once the storage registers of the reference registers of all of the band circuits have been loaded with the reference signal amplitudes so determined, the user of the signal representation generator is ready to obtain a representation of the signal that is impressed at the generator input 44 as will now be described.

Once the number of octave circuits to be used in the signal representation generator has been included therein, along with the selected number of band circuits in each of the octave circuits, and the clock rates and reference signal amplitudes have been chosen and the latter entered into the reference registers of the correlators of the band circuits, the signal representation generator is ready for use. Such use is commenced by connecting the device that produces the signal to be represented to the generator input 44, starting the recorder, and resetting the clock 46 and counter 62 to synchronize the signal representation generator to the selected information plane grid.

As the signal appears at the generator input 44, it is transmitted to the filters of all the band circuits so that the signal is separated into a plurality of signal components, each of which lies within a different frequency band to which one of the filters responds. These signal components are transmitted to the A/D converters so that digitized representations can be produced by each of the A/D converters each time the octave circuit of which the A/D converter is a part receives a clock pulse from the clock 46.

As time proceeds, each of the octave circuits will receive a sequence of clock pulses on the clock paths 48-56 so that the A/D converters included in the band circuits of the octave circuits will periodically generate a digital signal expressing the amplitude of a particular signal component of the signal to be represented by the signal representation generator. Each of these digital signals is transmitted to the even and odd correlators to which the A/D converters are connected and clocked, one-by-one, into the signal registers of the correlators. Thus, at some time after the signal representation generator has been started, each of the signal registers of each of the even and odd correlators of all band circuits will contain a segment of a signal component within a particular frequency band and such segment will be correlated, with reception of a clock pulse by each octave circuit of the signal representation generator. The resulting correlation signals are outputted to the multiplexer so that one such correlation signal, corresponding to one particular cell of the information plane identified by the count provided to the select terminals of the multiplexer by the counter, will be transmitted by the multiplexer to the recorder for recording. Since the reference and signal registers in a correlator contain the same number of storage registers, the lengths of the signal segments correlated will have different time durations from band-to-band and such time durations reflect the different numbers of sampling time intervals for the bands of each octave and the different clocking rates for the octave circuit. Such number is made inversely proportional to the logarithmic center frequencies of the bands of each octave by the selection of a number of storage registers in the reference registers in accordance with equation (5) as discussed above and duplicated from octave to octave by the halving of clocking rates of the octave circuits.

An important aspect of the present invention is that a representation generated by a signal representation generator constructed as described above will correspond to a substantially constant information content for each cell of the information plane so that the representation provided by the signal representation generator will present the maximum information that can be obtained from a signal. This benefit was the basis for the Gabor and Morlet proposals that a signal be decomposed on an information plane and it was to obtain this benefit that Gabor and Morlet suggested that the information plane grid be divided into cells of equal area. However, neither the Gabor nor Morlet proposals could be practically implemented with the information plane grids that were proposed. In the grid proposed by Gabor, lower frequency bands would have to be grossly oversampled to provide reasonably precise correlation signals for high frequency bands, particularly where phase information about a signal is desired and, in the information plane grid proposed by Morlet, the time extents of the cells would be related by irrational numbers so that a series of cells could not be corresponded with clock times necessary to carry out an implementation of Morlet's proposal without extreme difficulties in obtaining the representation. The present invention meets the constant information content per cell requirement necessary for achieving a maximum information representation, while at the same time dividing the information plane into cells having rationally related time extents permitting practical implementation of a signal representation generator, by causing the segments of the signal components correlated with the reference signals to have different time durations selected by clocking all band circuits in each octave circuit at the same rate while dividing the standard wavelet into different numbers of correlation signal intervals for different band circuits and entering reference signal amplitudes derived from the wavelet amplitude at the end points of the intervals into different numbers of storage registers of which the reference registers of the band circuits are comprised. That is, for a band circuit that responds to the highest frequency band of an octave of the information plane, the number of storage registers in the reference registers of the band circuit correlators will be the number $N_0$ which is selected as has been described above. Thus the time duration of a segment of a signal component correlated with a reference signal for a band having a band index number $k=0$ will be the product of $N_0$ and the sampling time interval at which the octave circuit which includes such band circuit is clocked. For the other bands in the octave circuit, the number of reference signal intervals used to obtain wavelet amplitudes for deriving reference signal values to be entered into the reference registers of the correlators of the band circuits are increased with increasing band circuit index number so that increasing numbers of storage registers are included in the correlators of the band circuits for increasing values of the band index number $k$ so that the duration of a segment of a signal component correlated with the reference signal for increasing value of the index $k$ increases in accordance with equation (5) for different band circuits of each octave circuit. That is, since the sampling time interval defined by the rate at which an octave circuit is clocked is the same for all band circuits in an octave circuit and the reference and signal registers in the correlators of each band circuit contain the same number of storage registers so that the number of sampling time intervals for each band is the same as the number of reference signal intervals for the band, the duration of the signal component segment correlated with a reference signal increases with increasing band index number in accordance with equation (5). Since the logarithmic center frequencies to which the filters in the band circuits respond decrease with increasing band index number in accordance with equation (2), the decrease in logarithmic center of the frequency band to which each band circuit responds is just offset by such increasing duration of the segments of the signal components correlated with the reference signal with increasing band index number, as can be seen by comparing equations (2) and (5). Thus, all cells for each octave of the information plane associated with the signal representation generator will have constant information content. The constant information content characteristic of the cells is then carried from octave to octave by clocking each octave circuit at a successively lower rate with increasing octave circuit index number n on factors of two and repeating the pattern of reference signal intervals used to derive the reference signals for the band circuit correlator reference registers from octave circuit to octave circuit. That is, as the frequency associated with two bands having the same band index number k decreases from one octave circuit to a successive octave circuit that responds to lower portions of the frequency range used to carry out the representation, the clocking rate also decreases by a factor of two to double the duration of a signal component segment used to carry out the correlation in the octave circuit corresponding to the lower frequency range. That is, the doubling of the sampling time interval defined by the clocking rate of an octave circuit while maintaining the number of amplitudes to be entered into a register, one amplitude being entered into a register in an octave circuit per sampling time interval, doubles the duration of a signal component segment correlated with a reference signal as the octave index number increases by one while the band index number is held constant. The doubling of the duration of a segment of a signal component in the lower frequency octave combined with the halving of the frequencies of the bands from octave to octave with increasing octave circuit index n then causes two information plane cells having the same band index number k to have the same information content without regard to the octave index number of the cell. Thus, since the information content of all cells in each octave of the information plane have constant information content and cells in different octaves of the information plane having the same band index number k have the same information content, all cells of the information plane will contain the same amount of information about the signal being represented.

In the preferred embodiment shown, the information generator 20 is comprised of reference registers, each of which is comprised of a plurality of storage registers, multiplier circuits, adder circuits and multiplexers which are related to each other only through their inclusion in the signal representation generator 20. However, it is recognized that these registers and other components can be related to each other in an additional way. In particular, the reference registers can be registers that are found in the memory of a general purpose digital computer and, in such case, the multiplier circuits, adder circuits and multiplexers would be comprised of the central processing unit of the computer and registers in the memory of the computer that would supply appropriate instructions to the central processing unit of the computer to carry out the correlations of the signal components of the signal that is represented by the signal representation generator. In such case, the A/D converters would be connected to appropriate input ports of the computer and the recorder would be connected to an appropriate output port of the computer as is conventional in the computer art.

Figure 11:
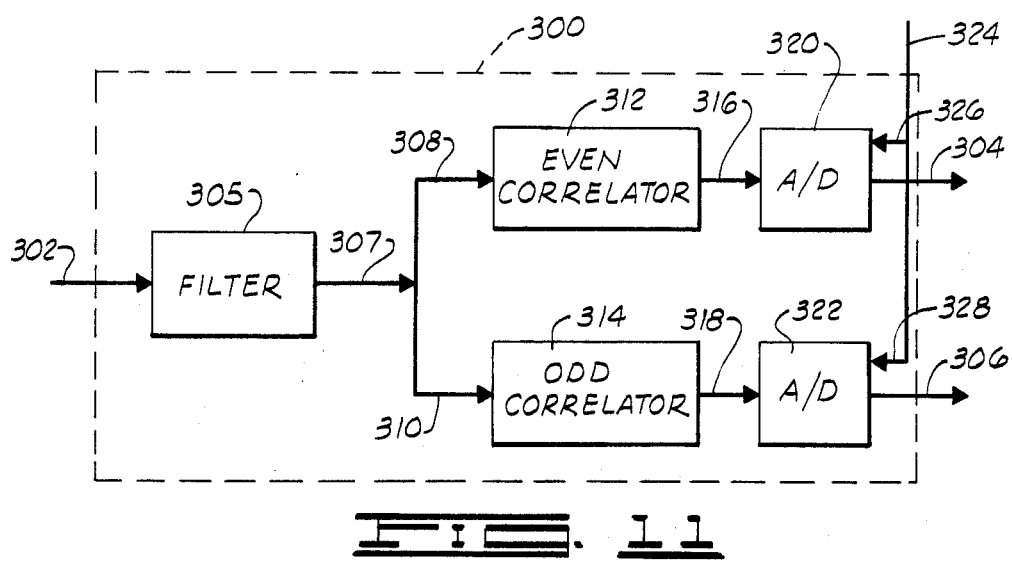
FIG. 11 is a second embodiment of a band circuit for the signal representation generator.

Description of FIG. 11

Referring now to FIG. 11, shown therein and designated by the general reference numeral 300 is a second form of band circuit particularly suited for use in the signal representation generator 20 when the generator 20 is used to represent signals lying in relatively high frequency ranges. Like the band circuits 84–90, the band circuit 300 receives a signal to be represented, on a signal path 302, and provides digitized outputs to the multiplexer 58 on channels 304 and 306, the output on channel 304 providing an even correlation value for a particular frequency band of the information plane and the output on channel 306 providing an odd correlation value for such frequency band. As in the band circuits 84–90, such frequency band is selected by a bandpass filter which has been indicated at 304 in FIG. 11.

However, in the band circuit 30, correlation is carried out prior to digitization as will now be discussed. As shown in FIG. 11, the output of filter 304 is transmitted via signal paths 306–310 to even and odd correlators 312 and 314 which are analog circuits designed to provide continuous, as opposed to discrete, correlation signals, on signal paths 316 and 318 respectively, to A/D converters 320 and 322. Such correlators 312 and 314 can be any of the known analog correlators which have been developed, for example, for use in seismic prospecting. In order to use such correlators in the signal representation generator 20, the transfer function of the correlators would be selected in a conventional manner to cause the signal component provided by the filter 304 to be continuously correlated with reference signals having the form expressed in equations (3) and (4). Thus, it will be noted, segments of the signal components having different time durations, corresponding to the time durations of signals digitally expressed in the signal registers of the band circuits 84–90, will be continuously correlated with reference signals derived from the standard wavelet so that the correlators 312, 314 will provide continuous correlation signals analogous to the correlation signals produced by the band circuits 84–90. These continuous correlation signals are then digitized by the A/D converters 320, 322 in response to periodic clock pulses received on the clock paths 324–328 so that the A/D converters provide correlation signals that are the same as the correlation signals provided by the even and odd correlators of the band circuits 84–90 for recording. The operation of a signal representation generator using band circuits constructed in accordance with the band circuit 300 shown in FIG. 11 will, accordingly, be identical to the operation of the signal representation generator 20 that has been discussed above.

An important quality criterion of the representation of a signal is the fidelity with which it is possible to recover the initial signal from its representation.

This new representation makes it simple and precise by allowing an accurate reconstruction of the signal derived from:

(1) the wavelets related to every cell of the grid of FIG. 7;

(2) the sampled values of the representation, related to the same cells of the grid of FIG. 7, obtained by crosscorrelation as described above; and (3) a scaling factor which compensates for the gain variations, the wavelet normalization and the oversampling used during the decomposition. Such scaling factor is determined by requiring a constant energy per reference signal and for constant cell area.

More particularly, the signal can be reconstructed by interpolating in time the representations in each frequency band and summing over the whole frequency range the narrow band signals thus obtained.

It is clear that the present invention is well adapted to carry out the objects and attain the ends and advantages mentioned as well as those inherent therein. While a presently preferred embodiment of the invention has been described for purposes of this disclosure, numerous changes may be made which will readily suggest themselves to those skilled in the art and which are encompassed within the spirit of the invention disclosed and as defined in the appended claims.

What is claimed is:

1. A method for generating a representation of an arbitrary signal, comprising the steps of:
    separating the signal into signal components within different overlapping frequency bands;
    selecting a correlation time interval for each frequency band;
    repetitively correlating a segment of the signal component in each band with a reference signal derived from a standard wavelet having both time and frequency characteristics to obtain a sequence of correlation signals for each band, wherein the segment of the signal component of each band that is correlated with the reference signal has a time duration equal to the correlation time interval for that band; and
    recording said correlation signals.

2. The method of claim 1 wherein said bands are selected to divide a selected frequency range into equal intervals of logarithm of frequency; and wherein the durations of the segments of the signal components correlated with the reference signal are ininverse proportion to the logarithmic center frequencies of the bands.

3. The method of claim 1 wherein the standard wavelet is characterized as having an even part formed by limiting a cosine wave with a preselected envelope and an odd part formed by limiting a sine wave with said preselected envelope; and wherein the step of correlating a segment of the signal component in each band with the reference signal is further characterized as correlating the segment of the signal component in each band with each of an even part of the reference signal derived from the even part of the standard wavelet and an odd part of the reference signal derived from an odd part of the standard wavelet.

4. The method of claim 2 wherein the standard wavelet is characterized as having an even part formed by limiting a cosine wave with a preselected envelope and an odd part formed by limiting a sine wave with said preselected envelope; and wherein the step of correlating a segment of the signal component in each band with the reference signal is further characterized as correlating the segment of the signal component in each band with each of an even part of the reference signal derived from the even part of the standard wavelet and an odd part of the reference signal derived from an odd part of the standard wavelet.

5. The method of claim 2 wherein the logarithms of frequency selected to divide said frequency range into bands are to the base two, whereby the frequency bands are grouped into a sequence of octaves each associated with a portion of said frequency range; wherein the selected correlation time intervals are the same for all bands in each octave; and wherein the selected correlation time intervals for octaves associated with successively higher frequency portions of said frequency range decrease by a factor of two from octave to octave.

6. The method of claim 5 wherein the step of correlating a segment of the signal component within a frequency band with the reference signal comprises the steps of:
    storing a succession of amplitudes of the reference signal corresponding to a sequence of sampling points dividing the standard wavelet into a selected number of equal reference signal intervals;
    storing a succession of amplitudes of the signal component corresponding to a sequence of sampling times dividing said segment of the signal component into a selected number of equal sampling time intervals, wherein the number of sampling time intervals into which said segment of the signal is divided is equal to the number of reference signal intervals into which the reference signal is divided; and
    correlating the stored amplitudes of the signal component with the stored amplitudes of the reference signal to obtain a correlation signal.

7. The method of claim 6 wherein the sampling time intervals for frequency bands in each octave are the same for all bands in the octave; wherein the sampling time intervals for octaves associated with successively higher frequency portions of said frequency range decrease by a factor of two from octave to octave; wherein the number of sampling time intervals selected for the bands in each octave varies from band to band in substantially inverse proportion to the logarithmic center frequencies of the bands; and wherein the set of numbers of sampling time intervals selected for the bands of one octave are selected for the bands of all octaves.

8. The method of claim 4 wherein the logarithms of frequency selected to divide said frequency range into bands are to the base two, whereby the frequency bands are grouped into a sequence of octaves each associated with a portion of said frequency range; wherein the selected correlation time intervals are the same for all bands in each octave; and wherein the selected correlation time intervals for octaves associated with successively higher frequency portions of said frequency range decrease by a factor of two from octave to octave.

9. The method of claim 8 wherein the steps of correlating a segment of the signal component within a frequency band with the even and odd parts of the reference signal comprises the steps of:
    storing a succession of amplitudes of each of the even and odd parts of the reference signal corresponding to a sequence of sampling points dividing each of the even and odd parts of the standard wavelet into a selected number of equal reference signal intervals;
    storing a succession of amplitudes of the signal component corresponding to a sequence of sampling times dividing said segment of the signal component into a selected number of equal sampling time intervals, wherein the number of sampling time intervals into which said segment of the signal is divided is equal to the number of reference signal intervals into which of the even and odd parts of the reference signal is divided; and correlating the stored amplitudes of the signal component with the stored amplitudes of each of the even and odd parts of the reference signal to obtain a correlation signal.

10. The method of claim 9 wherein the sampling time intervals for frequency bands in each octave are the same for all bands in the octave; wherein the sampling time intervals for octaves associated with successively higher frequency portions of said frequency range decrease by a factor of two from octave to octave; wherein the number of sampling time intervals selected for the bands in each octave varies from band to band in substantially inverse proportion to the logarithmic center frequencies of the bands; and wherein the set of numbers of sampling time intervals selected for the bands of one octave are selected for the bands of all octaves.

11. An apparatus for generating a representation of an arbitrary signal, comprising:

a plurality of octave circuits, each octave circuit associated with a selected octave of a selected frequency range, for receiving the signal and generating a set of correlation values between different frequency components of the signal and a reference signal derived from a standard wavelet having both time and frequency characteristics in response to reception by the octave circuit of a selected number of clock pulses defining a correlation time interval for the octave circuit;

clock means for providing the clock pulses to the octave circuits, the clock means providing clock pulses to different octave circuits at rates that increase by a factor of two for octave circuits associated with successively higher octaves of the frequency range, whereby said correlation time intervals decrease by a factor of two for octave circuits associated with successively higher octaves of the frequency range; and means for recording the correlation values at times controlled by said clock.

12. The apparatus of claim 11 wherein each octave circuit comprises a plurality of band circuits, each band circuit, associated with a selected frequency band of the octave of the frequency range with which the octave circuit is associated, generating one member of the set of correlation values for each correlation time interval of the octave circuit.

13. The apparatus of claim 12 wherein the frequency bands associated with the band circuits of each octave circuit divide the octave of frequency associated with the octave circuit into equal intervals of logarithm, to the base two, of frequency.

14. The apparatus of claim 13 wherein each band circuit comprises:

a bandpass filter receiving said signal and passing a selected frequency component of the signal within the frequency band with which the band circuit is associated;

an A/D converter connected to the bandpass filter to receive the signal component passed thereby, the A/D converter receiving the clock pulses received by the octave circuit of which the A/D converter is a part to provide a digital representation of the amplitude of the signal component received by the A/D converter in response to each of said clock pulses; and signal correlation means for correlating a succession of amplitudes provided by the A/D converter with a succession of amplitudes of the reference signal derived from the standard wavelet.

15. The apparatus of claim 14 wherein the signal correlation means comprises:

a reference register comprising a plurality of storage registers, each storage register containing a digital representation of one amplitude of the reference signal;

a signal register, connected to the A/D converter and the clock means to receive the digital representations of the signal amplitudes provided by the A/D converter and the clock pulses received by the octave circuit of which the signal register is a part, the signal register comprising a plurality of serially connected storage registers for storing a succession of signal component amplitudes and shifting the stored signal component amplitudes serially through the storage registers in response to a clock signal received by the signal register, the signal register having a number of storage registers equal to the number of storage registers of said reference register and each storage register of the signal register corresponding to a selected storage register of the reference register;

a term-by-term multiplier circuit connected to the output terminals of the storage registers of said reference and signal registers, the multiplier circuit connected to the clock means to receive the clock pulses received by the octave circuit of which the multiplier circuit is a part for multiplying the contents of each storage register of said reference register by the contents of the corresponding storage register of said signal register in response to a clock pulse received by the multiplier circuit; and an adder circuit, connected to the multiplier circuit and to the clock means so as to receive the products formed by the multiplier circuit and clock pulses received by the octave circuit of which the adder is a part, for adding said products in response to a clock pulse received by the adder circuit.

16. The apparatus of claim 15 wherein the number of storage registers in each of the reference and signal registers varies from band circuit to band circuit within each octave circuit substantially in inverse proportion to the logarithmic centers of the frequency bands with which the band circuits are associated.

17. The apparatus of claim 14 wherein the reference signal is characterized as having an even part and an odd part; and wherein the signal correlation means comprises:

even signal correlation means for correlating a succession of amplitudes provided by the A/D converter with a succession of amplitudes of the even part of the reference signal; and odd signal correlation means for correlating a succession of amplitudes provided by the A/D converter with a succession of amplitudes of the odd part of the reference signal; and wherein each of the even signal correlation means and the odd signal correlation means comprises:

a reference register comprising a plurality of storage registers, each storage register containing a digital representation of one amplitude of the reference signal;

a signal register, connected to the A/D converter and the clock means to receive the digital representations of the signal amplitudes provided by the A/D converter and the clock pulses received by the octave circuit of which the signal register is a part, the signal register comprising a plurality of serially connected storage registers for storing a succession of signal component amplitudes and shifting the stored signal component amplitudes serially through the storage registers in response to a clock signal received by the signal register, the signal register having a number of storage registers equal to the number of storage registers of said reference register and each storage register of the signal register corresponding to a selected storage register of the reference register;

a term-by-term multiplier circuit connected to the output terminals of the storage registers of said reference and signal registers, the multiplier circuit connected to the clock means to receive the clock pulses received by the octave circuit of which the multiplier circuit is a part for multiplying the contents of each storage register of said reference register by the contents of the corresponding storage register of said signal register in response to a clock pulse received by the multiplier circuit; and an adder circuit, connected to the multiplier circuit and to the clock means so as to receive the products formed by the multiplier circuit and clock pulses received by the octave circuit of which the adder is a part, for adding said products in response to a clock pulse received by the adder circuit.

18. The apparatus of claim 17 wherein the number of storage registers in each of the reference and signal registers of the even correlation means of a band circuit is equal to the number of storage registers in each of the reference and signal registers of the odd correlation means of the band circuit and wherein the number of storage registers in each of the reference and signal registers of the band circuits varies from band circuit to band circuit within each octave circuit substantially in inverse proportion to the logarithmic centers of the frequency bands with which the band circuits are associated.

* * * * *

UNITED STATES PATENT AND TRADEMARK OFFICE
CERTIFICATE OF CORRECTION

PATENT NO. : 4,599,567
DATED : Jul. 8, 1986
INVENTOR(S) : Pierre L. Goupillaud, Jean P. Morlet, and Alexandre Grossmann It is certified that error appears in the above-identified patent and that said Letters Patent is hereby corrected as shown below:

Column 6, line 26, the equation:

"$j=2^n+m\ 2^{n+1},\ m=0,\ 1,\ 2$"

should be:

--$j=2^n+m\ 2^{n+1},\ m=0,\ 1,\ 2\ \ldots\ .$--.

Column 12, line 39, the expression:

"$g_0(t)=\exp[-(f_{n,k}t)^2 \ln 2]\cos(2\pi f_{n,k}t)$"

should be:

--$g_0(t)=\exp[-(f_{n,k}t)^2 \ln 2]\sin(2\pi f_{n,k}t)$--.

Signed and Sealed this

Fourteenth Day of October, 1986

[SEAL]

*Attest:*

DONALD J. QUIGG

*Attesting Officer*     *Commissioner of Patents and Trademarks*